(12) United States Patent
Hashimoto

(10) Patent No.: US 12,272,875 B2
(45) Date of Patent: Apr. 8, 2025

(54) RADIO WAVE ABSORBER

(71) Applicant: FUJIFILM Corporation, Tokyo (JP)

(72) Inventor: Hirokazu Hashimoto, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 510 days.

(21) Appl. No.: 17/517,910

(22) Filed: Nov. 3, 2021

(65) Prior Publication Data

US 2022/0059945 A1 Feb. 24, 2022

Related U.S. Application Data

(63) Continuation of application No. PCT/JP2020/018622, filed on May 8, 2020.

(30) Foreign Application Priority Data

May 14, 2019 (JP) ................. 2019/091327

(51) Int. Cl.
  H01Q 17/00 (2006.01)
  H01F 1/34 (2006.01)
(52) U.S. Cl.
  CPC ........... H01Q 17/004 (2013.01); H01F 1/348 (2013.01)
(58) Field of Classification Search
  CPC .............................. H01Q 17/004; H01F 1/348
  USPC ........................................................... 342/1
  See application file for complete search history.

(56) References Cited

U.S. PATENT DOCUMENTS

| | | | | |
|---|---|---|---|---|
| 6,419,847 | B1* | 7/2002 | Toyota | C04B 35/2633 252/62.63 |
| 10,249,417 | B2* | 4/2019 | Morita | C01G 51/68 |
| 10,622,127 | B2* | 4/2020 | Sakane | G11B 5/842 |
| 10,919,778 | B2* | 2/2021 | Sakane | G11B 5/714 |
| 12,112,871 | B2 | 10/2024 | Hashimoto | |
| 12,125,622 | B2 | 10/2024 | Hashimoto | |
| 2003/0044623 | A1* | 3/2003 | Sakurai | H05K 9/0088 428/447 |
| 2003/0044633 | A1 | 3/2003 | Nagaraj et al. | |
| 2003/0079893 | A1 | 5/2003 | Hashimoto et al. | |
| 2004/0036645 | A1 | 2/2004 | Fujieda et al. | |
| 2004/0227663 | A1 | 11/2004 | Suzuki et al. | |
| 2005/0282043 | A1 | 12/2005 | Yamazaki et al. | |
| 2007/0131894 | A1 | 6/2007 | Takada et al. | |
| 2007/0241962 | A1 | 10/2007 | Shinoda et al. | |
| 2009/0266604 | A1* | 10/2009 | Tokiwa | C08J 5/18 524/413 |

(Continued)

FOREIGN PATENT DOCUMENTS

| | | |
|---|---|---|
| CN | 102473514 A | 5/2012 |
| CN | 102473519 A | 5/2012 |

(Continued)

OTHER PUBLICATIONS

Office Action issued May 25, 2023 in U.S. Appl. No. 17/518,825.

(Continued)

*Primary Examiner* — Nuzhat Pervin
(74) *Attorney, Agent, or Firm* — Sughrue Mion, PLLC

(57) ABSTRACT

There is provided a radio wave absorber including a magnetic powder and a binder, in which a volume filling rate of the magnetic powder in the radio wave absorber is 35% by volume or less, a transmission attenuation amount is 8.0 dB or more, and a reflection attenuation amount is 8.0 dB or more.

19 Claims, 1 Drawing Sheet

10: Radio wave absorber
20: Magnetic powder
30: Binder

(56) References Cited

U.S. PATENT DOCUMENTS

| | | | |
|---|---|---|---|
| 2010/0060539 | A1 | 3/2010 | Suetsuna et al. |
| 2010/0238063 | A1 | 9/2010 | Ohkoshi et al. |
| 2012/0100064 | A1 | 4/2012 | Ohkoshi et al. |
| 2012/0105185 | A1 | 5/2012 | Oda et al. |
| 2013/0140076 | A1 | 6/2013 | Lee et al. |
| 2014/0091501 | A1 | 4/2014 | Hattori et al. |
| 2015/0187380 | A1 | 7/2015 | Shirata |
| 2017/0275438 | A1 | 9/2017 | Kobayashi et al. |
| 2018/0009677 | A1* | 1/2018 | Aga ........................ H01F 1/348 |
| 2018/0370197 | A1 | 12/2018 | Nagamune et al. |
| 2019/0051436 | A1* | 2/2019 | Imaoka ..................... H01F 1/22 |
| 2019/0215994 | A1* | 7/2019 | Hiroi ....................... B32B 15/08 |
| 2019/0312356 | A1* | 10/2019 | Fujita ..................... H01F 1/375 |
| 2019/0380232 | A1* | 12/2019 | Machinaga .............. B32B 7/02 |
| 2020/0008328 | A1* | 1/2020 | Hiroi ....................... H01F 1/113 |
| 2020/0227833 | A1* | 7/2020 | Hiroi ....................... C01G 49/00 |
| 2020/0335247 | A1 | 10/2020 | Hosoya et al. |
| 2021/0151895 | A1* | 5/2021 | Ohkoshi .................. H01F 1/375 |
| 2021/0166849 | A1 | 6/2021 | Hashimoto |
| 2021/0179442 | A1* | 6/2021 | Chen .................. H01F 41/0246 |
| 2021/0194147 | A1 | 6/2021 | Nagano |
| 2022/0039301 | A1 | 2/2022 | Hashimoto |
| 2022/0059946 | A1 | 2/2022 | Hashimoto |
| 2022/0061198 | A1 | 2/2022 | Shirata et al. |
| 2022/0167535 | A1 | 5/2022 | Nakai et al. |
| 2022/0376402 | A1 | 11/2022 | Hashimoto |

FOREIGN PATENT DOCUMENTS

| | | | | |
|---|---|---|---|---|
| CN | 107032776 | A | 8/2017 | |
| CN | 107227023 | A | 10/2017 | |
| CN | 107406272 | A | 11/2017 | |
| CN | 108370654 | A | 8/2018 | |
| CN | 109265155 | A | 1/2019 | |
| DE | 37 29 693 | A1 | 5/1988 | |
| EP | 2708513 | A1 * | 3/2014 | ............ B82Y 30/00 |
| EP | 3 435 386 | A1 | 1/2019 | |
| EP | 3537860 | A1 * | 9/2019 | ............ B32B 25/02 |
| EP | 3573439 | A1 | 11/2019 | |
| EP | 3 643 752 | A1 | 4/2020 | |
| EP | 3 943 451 | A1 | 1/2022 | |
| EP | 3 537 860 | B1 | 10/2022 | |
| JP | 57-180206 | A | 11/1982 | |
| JP | 63-155700 | A | 6/1988 | |
| JP | 64-707 | A | 1/1989 | |
| JP | 5-206676 | A | 8/1993 | |
| JP | 7-30279 | A | 1/1995 | |
| JP | 8-340191 | A | 12/1996 | |
| JP | H 9-115708 | A | 5/1997 | |
| JP | 11-354972 | A | 12/1999 | |
| JP | 2000-228599 | A | 8/2000 | |
| JP | 2000-232294 | A | 8/2000 | |
| JP | 2001-156487 | A | 6/2001 | |
| JP | 2002118008 | A * | 4/2002 | ............ H01F 10/08 |
| JP | 2002-185180 | A | 6/2002 | |
| JP | 2002-217586 | A | 8/2002 | |
| JP | 2003-282319 | A | 10/2003 | |
| JP | 2003-332784 | A | 11/2003 | |
| JP | 2004-96084 | A | 3/2004 | |
| JP | 2004-296541 | A | 10/2004 | |
| JP | 2005-033156 | A | 2/2005 | |
| JP | 2005-231931 | A | 9/2005 | |
| JP | 2007-129179 | A | 5/2007 | |
| JP | 2007-250823 | A | 9/2007 | |
| JP | 2008-21990 | A | 1/2008 | |
| JP | 2008-63199 | A | 3/2008 | |
| JP | 2008-169378 | A | 7/2008 | |
| JP | 4173424 | B2 * | 10/2008 | ............ H01F 10/08 |
| JP | 2008-300801 | A | 12/2008 | |
| JP | 2010-77198 | A | 4/2010 | |
| JP | 2010-114407 | A | 5/2010 | |
| JP | 2010-184840 | A | 8/2010 | |
| JP | 2010-260766 | A | 11/2010 | |
| JP | 2010-283301 | A | 12/2010 | |
| JP | 4674380 | B2 | 4/2011 | |
| JP | 2011-93762 | A | 5/2011 | |
| JP | 2011-178654 | A | 9/2011 | |
| JP | 2012-9797 | A | 1/2012 | |
| JP | 5161813 | B2 | 3/2013 | |
| JP | 2013-526775 | A | 6/2013 | |
| JP | 2013-239637 | A | 11/2013 | |
| JP | 5481538 | B2 | 4/2014 | |
| JP | 2015-127985 | A | 7/2015 | |
| JP | 2016-204499 | A | 12/2016 | |
| JP | 2018-056492 | A | 4/2018 | |
| JP | 2018-110167 | A | 7/2018 | |
| JP | 2018147999 | A * | 9/2018 | ............ B32B 15/08 |
| JP | 2018-154541 | A | 10/2018 | |
| JP | 2019-012799 | A | 1/2019 | |
| JP | 6521415 | B2 | 5/2019 | |
| JP | 2019-104954 | A | 6/2019 | |
| KR | 10-0675514 | B1 | 1/2007 | |
| WO | 2016/117648 | A1 | 7/2016 | |
| WO | 2018/084234 | A1 | 5/2018 | |
| WO | 2018/168859 | A1 | 9/2018 | |
| WO | 2018/235952 | A1 | 12/2018 | |
| WO | 2019/004104 | A1 | 1/2019 | |
| WO | 2019/017471 | A1 | 1/2019 | |
| WO | 2019/131675 | A1 | 7/2019 | |

OTHER PUBLICATIONS

K. Sadhana et al., "Structural and magnetic properties of nanocrystalline $BaFe_{12}O_{19}$ synthesized by microwave-hydrothermal method", Appl Nanosci, 2012, vol. 2, pp. 247-252 (6 pages).

Office Action issued Nov. 28, 2022 in Korean Application No. 10-2021-7035736, corresponds to U.S. Appl. No. 17/518,825.

Office Action issued Oct. 25, 2022 in Japanese Application No. 2021-519388, corresponds to U.S. Appl. No. 17/518,825.

Extended European Search Report dated Jun. 13, 2022 from the European Patent Office in EP Application No. 20806133.3, corresponds to U.S. Appl. No. 17/518,825.

International Search Report issued Jun. 30, 2020 in International Application No. PCT/JP2020/011872, corresponds to U.S. Appl. No. 17/503,509.

Written Opinion of the International Searching Authority issued Jun. 30, 2020 in International Application No. PCT/JP2020/011872, corresponds to U.S. Appl. No. 17/503,509.

International Preliminary Report on Patentability issued Nov. 16, 2021 in International Application No. PCT/JP2020/011872, corresponds to U.S. Appl. No. 17/503,509.

Extended European Search Report issued Jul. 1, 2022 in European Application No. 20806852.8, corresponds to U.S. Appl. No. 17/503,509.

Notice of Reasons for Refusal dated Oct. 25, 2022 from the Japanese Patent Office in Japanese Application No. 2021-519287, corresponds to U.S. Appl. No. 17/503,509.

Office Action dated Dec. 13, 2022 from the Korean Intellectual Property Office in KR Application No. 10-2021-7034485, corresponds to U.S. Appl. No. 17/503,509.

Japanese Office Action dated Apr. 18, 2023 in Japanese Application No. 2021-519287, corresponds to U.S. Appl. No. 17/503,509.

International Search Report dated Aug. 25, 2020 in International Application No. PCT/JP2020/018621, corresponds to U.S. Appl. No. 17/518,889.

Written Opinion of the International Searching Authority dated Aug. 25, 2020 in International Application No. PCT/JP2020/018621, corresponds to U.S. Appl. No. 17/518,889.

International Preliminary Report on Patentability dated Nov. 16, 2021 in International Application No. PCT/JP2020/018621, corresponds to U.S. Appl. No. 17/518,889.

Extended European Search Report dated May 30, 2022 in European Application No. 20805058.3, corresponds to U.S. Appl. No. 17/518,889.

Notice of Reasons for Refusal dated Jun. 21, 2022 from the Japanese Patent Office in Japanese Application No. 2021-519405, corresponds to U.S. Appl. No. 17/518,889.

Japanese Office Action dated Dec. 20, 2022 in Japanese Application No. 2021-519405, corresponds to U.S. Appl. No. 17/518,889.

Korean Office Action dated Dec. 19, 2022 in Korean Application No. 10-2021-7036224, corresponds to U.S. Appl. No. 17/518,889.

(56) References Cited

OTHER PUBLICATIONS

Office Action issued Jun. 29, 2023 in Korean Application No. 10-2021-7036224, corresponds to U.S. Appl. No. 17/518,889.
International Search Report dated Oct. 20, 2020 issued by the International Searching Authority in Application No. PCT/JP2020/029622, corresponds to U.S. Appl. No. 17/666,894.
Written Opinion dated Oct. 20, 2020 issued by the International Searching Authority in Application No. PCT/JP2020/029622, corresponds to U.S. Appl. No. 17/666,894.
International Preliminary Report on Patentability dated Feb. 8, 2022 with a Translation of the Written Opinion of the International Searching Authority in Application No. PCT/JP2020/029622, corresponds to U.S. Appl. No. 17/666,894.
Extended European Search Report dated Sep. 30, 2022 in EP Application No. 20852946.1, corresponds to U.S. Appl. No. 17/666,894.
Office Action dated Feb. 14, 2023 from the Japanese Patent Office in JP Application No. 2021-539210, corresponds to U.S. Appl. No. 17/666,894.
Office Action dated Mar. 21, 2023 from the Korean Intellectual Property Office in KR Application No. 10-2022-7004173, corresponds to U.S. Appl. No. 17/666,894.
International Search Report dated Aug. 13, 2019 from the International Searching Authority in International Application No. PCT/JP2019/022347, corresponds to U.S. Appl. No. 17/173,437.
Written Opinion dated Aug. 13, 2019 from the International Bureau in International Application No. PCT/JP2019/022347, corresponds to U.S. Appl. No. 17/173,437.
International Preliminary Report on Patentability dated Mar. 2, 2021 from the International Bureau in International Application No. PCT/JP2019/022347, corresponds to U.S. Appl. No. 17/173,437.
Extended European Search Report issued Oct. 1, 2021 in European Application No. 19854513.9, corresponds to U.S. Appl. No. 17/173,437.
Notification of Reason for Refusal dated Jan. 14, 2022 from the Korean intellectual Property Office in KR Application No. 10-2021-7004268, corresponds to U.S. Appl. No. 17/173,437.
International Search Report dated Dec. 8, 2020 in International Application No. PCT/JP2020/033846, corresponds to U.S. Appl. No. 17/697,268.
Written Opinion of the International Searching Authority dated Dec. 8, 2020 in International Application No. PCT/JP2020/033846, corresponds to U.S. Appl. No. 17/697,268.
International Preliminary Report on Patentability dated Apr. 5, 2022 in International Application No. PCT/JP2020/033846, corresponds to U.S. Appl. No. 17/697,268.
Extended European Search Report dated Oct. 24, 2022 in European Application No. 20871943.5, corresponds to U.S. Appl. No. 17/697,268.
Korean Office Action dated Apr. 7, 2023 in Korean Application No. 10-2022-7009991, corresponds to U.S. Appl. No. 17/697,268.
European Office Action dated Apr. 14, 2023 in European Application No. 20871943.5, corresponds to U.S. Appl. No. 17/697,268.
Office Action issued Aug. 3, 2023 in Chinese Application No. 202080035152.9, corresponds to U.S. Appl. No. 17/518,889.
Office Action dated Jul. 25, 2023 in Japanese Application No. 2021-539210, corresponds to U.S. Appl. No. 17/666,894.
International Search Report issued Aug. 18, 2020 in International Application No. PCT/JP2020/018479, corresponds to U.S. Appl. No. 17/518,825.
Written Opinion of the International Searching Authority issued Aug. 18, 2020 in International Application No. PCT/JP2020/018479, corresponds to U.S. Appl. No. 17/518,825.
International Preliminary Report on Patentability issued Nov. 16, 2021 in International Application No. PCT/JP2020/018479, corresponds to U.S. Appl. No. 17/518,825.
Communication issued Dec. 14, 2023 in European Application No. 20 806 133.3, corresponding to U.S. Appl. No. 17/518,825.
Office Action issued Oct. 31, 2023 in Korean Application No. 10-2022-7009991, corresponding to U.S. Appl. No. 17/697,268.
Office Action issued Jan. 12, 2024 in U.S. Appl. No. 17/518,889.
International Search Report issued Aug. 25, 2020 in International Application No. PCT/JP2020/018622.
Written Opinion of the International Searching Authority issued Aug. 25, 2020 in International Application No. PCT/JP2020/018622.
International Preliminary Report on Patentability issued Nov. 16, 2021 in International Application No. PCT/JP2020/018622.
Communication dated Aug. 22, 2023, issued in European Application No. 20 806 852.8, corresponding to U.S. Appl. No. 17/503,509.
Office Action dated Mar. 6, 2024 in Chinese Application No. 202080035479.6.
Office Action issued Nov. 30, 2023 in U.S. Appl. No. 17/518,825.
Office Action issued Oct. 28, 2023 in Chinese Application No. 202080035150.X., corresponding to U.S. Appl. No. 17/518,825.
Korean Office Action dated Dec. 19, 2022 in Korean Application No. 10-2021-7036117.
Extended European Search Report dated May 30, 2022 in European Application No. 20806265.3.
Office Action dated Jun. 21, 2022 issued from the Japanese Patent Office in Japanese Application No. 2021-519406.
Notice of Allowance issued Jul. 3, 2024 in U.S. Appl. No. 17/518,825.
S. Kolev, et al., "Thermal Treatment Influence on the Magnetic Properties and Degree of Orientation of BaFe$_{12}$O$_{19}$ Films", J Supercond Nov Magn, 2012, vol. 25, pp. 2819-2824 (6 pages total).
Office Action issued Jun. 25, 2024 in U.S. Appl. No. 17/503,509.
Office Action issued Jul. 3, 2024 in U.S. Appl. No. 17/173,437.
Office Action issued May 8, 2024 in European Application No. 20 806 852.8.
Office Action issued Jul. 23, 2024 in European Application No. 20 805 058.3.
Communication dated Dec. 15, 2023, issued in Chinese Application No. 202080033792.6.
Office Action issued Sep. 26, 2023 in Japanese Application No. 2021-519287.
Communication dated Apr. 2, 2024, issued in Chinese Application No. 202080056518.0.
Office Action issued Dec. 21, 2023 in U.S. Appl. No. 17/173,437.
Clarivate Analystics machine translation of JP 5161813 B2 to Hitomi et al. published Mar. 13, 2013 (Year: 2013), 20 pages total.
Vinnik et al. "Growth of lead and aluminum substituted barium hexaferrite single crystals from lead oxide flux", Materials Science Forum, vol. 843, pp. 3-9. Published online Dec. 28, 2015 (Year: 2015), 7 pages total.
Shono et al. "Magneto-optical properties of magnetoplumbites BaFe12O19, SrFe12—xAlxO19 and PbFe12O19", Japanese Journal of Applied Physics, vol. 21, No. 10, pp. 1451-1454. Oct. 1982 (Year: 1982), 5 pages total.
Naoufal et al. "synthesis, structure and catalytic properties of Fe-substituted barium hexaaluminates", Catalyst Letters, 54, 1998, 141-148. Sep. 1998 (Year: 1998), 8 pages total.
Luo et al. "Physical and magnetic properties of highly aluminum doped strontium ferrite nanoparticles prepared by auto-combustion route", Journal of Magnetism and Magnetic Materials, 324, 2012, 2602-2608. published online Mar. 15, 2012 (Year: 2012), 7 pages total.
Notice of Allowance issued Apr. 22, 2024 in U.S. Appl. No. 17/518,889.
Office Action issued May 9, 2024 in U.S. Appl. No. 17/697,268.
B.D. Cullity, et al., "Introduction to Magnetic Materials," 2nd Edition 2009 by the Institute of Electrical and Electronics Engineers, John Wiley & Sons, Inc., 2009, pp. 1-550 (550 pages total).
Retno Rahmawati, et al., "Optimization of Frequency and Stirring Rate for Synthesis of Magnetite. (Fe$_3$O$_4$) Nanoparticles by Using Coprecipitation—Ultrasonic Irradiation Methods," Science Direct, Procedia Engineering 170, Elsevier Ltd, 2017, pp. 55-59 (5 pages total).
Md Jafar Sharif, et al., "Enhanced Magnetization in Highly Crystalline And Atomically Mixed bcc Fe—Co Nanoalloys Prepared by Hydrogen Reduction of Oxide Composites," Nanoscale, 2013, vol. 5, pp. 1489-1493 (5 pages total).
Office Action issued Sep. 25, 2023 in Korean Application No. 10-2022-7004173, corresponding to U.S. Appl. No. 17/666,894.
Office Action issued Aug. 27, 2024 in U.S. Appl. No. 17/697,268.
Office Action issued Jul. 20, 2024 in Chinese Application No. 202080033792.6, corresponding to U.S. Appl. No. 17/503,509.

(56) References Cited

OTHER PUBLICATIONS

Office Action dated Oct. 1, 2024 in Japanese Application No. 2023-111034; corresponds to U.S. Appl. No. 17/518,889.
Notice of Allowance dated Nov. 14, 2024 in U.S. Appl. No. 17/173,437.
Notice of Allowance issued Nov. 22, 2024 in U.S. Appl. No. 17/503,509.
Office Action issued Dec. 23, 2024 in U.S. Appl. No. 17/697,268.
Office Action issued Feb. 11, 2025 in U.S. Appl. No. 17/666,894.
English translation of JP 2010-077198 A (Shoen Ryo and Tetsuji Tokiwa, Apr. 8, 2010); 11 pages.

* cited by examiner

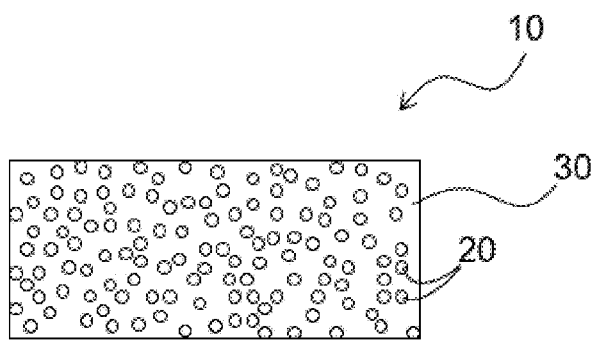
10: Radio wave absorber
20: Magnetic powder
30: Binder

RADIO WAVE ABSORBER

CROSS-REFERENCE TO RELATED APPLICATIONS

This application is a Continuation of PCT International Application No. FCT/JP2020/18622 filed on May 8, 2020, which claims priority under 35 U.S.C. § 119(a) to Japanese Patent Application No. 2019-091327 filed on May 14, 2019. Each of the above applications is hereby expressly incorporated by reference, in its entirety, into the present application.

BACKGROUND OF THE INVENTION

1. Field of the Invention

The present invention relates to a radio wave absorber.

2. Description of the Related Art

A radio wave absorber containing a magnetic powder as the radio wave absorbing material is known. In addition, examples of the radio wave absorber containing a magnetic powder include a radio wave absorber in which a magnetic powder is mixed a binder (see JP2018-56492A).

SUMMARY OF THE INVENTION

In recent years, as an electronic device that uses radio waves, a radar for recognizing an object by transmitting and receiving radio waves has attracted attention. For example, an on-vehicle radar transmits radio waves and receives the radio waves reflected by an object (such as a pedestrian, a vehicle, or the like), whereby it can recognize the presence of the object, the distance to the object, or the like. In order to prevent collision with an object, as necessary, an automatic driving control system of an automobile can automatically brake and stop the automobile or can automatically control the speed to keep the distance to the object based on the results obtained by the radar being recognizing the object.

In order to improve the reliability of the system that carries out various controls based on the results obtained by the radar being recognizing the object as described above, it is desired to improve the performance of the radar. For this reason, in recent years, it has begun to be examined to install a radio wave absorber on a front side (an incident side of the radio wave incident from the outside) of the radio wave transmitting and receiving unit of the radar to improve the recognition accuracy.

In consideration of the above, one aspect of the present invention is to provide a radio wave absorber that can contribute to improving the recognition accuracy of the radar.

One aspect of the present invention relates to;
a radio wave absorber comprising:
a magnetic powder; and
a binder,
in which a volume filling rate of the magnetic powder in the radio wave absorber is 35% by volume or less,
a transmission attenuation amount is 8.0 dB or more, and
a reflection attenuation amount is 8.0 dB or more.

In one aspect, the volume filling rate of the magnetic powder can be 15% by volume or more and 35% by volume or less.

In one aspect, the radio wave absorber can be a molded product obtained by molding a composition containing the magnetic powder and the binder.

In one aspect, the thickness of the radio wave absorber can be 2.0 mm or more and 10.0 mm or less.

In one aspect, the magnetic powder can include a powder of a hexagonal ferrite.

In one aspect, the hexagonal ferrite can have a composition represented by Formula 1.

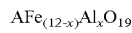

$$AFe_{(12-x)}Al_xO_{19} \quad \text{Formula 1}$$

(In Formula 1, A represents at least one kind of atom selected from the group consisting of Sr, Ba, Ca, and Pb, and x satisfies $1.50 \leq x \leq 8.00$.)

In one aspect, the atom represented by A in Formula 1 can include Sr.

In one aspect, the magnetic powder can include a powder of ε-iron oxide.

In one aspect, the ε-iron oxide can be an ε-iron oxide containing one or more atoms selected from the group consisting of a gallium atom, a titanium atom, and a cobalt atom.

According to one aspect of the present invention, it is possible to provide a radio wave absorber that can contribute to improving the recognition accuracy of the radar.

BRIEF DESCRIPTION OF THE DRAWING

The FIGURE depicts a cross-sectional schematic representation of an embodiment of the radio wave absorber (10) in which the magnetic powder (20) and the binder (30) are shown.

DESCRIPTION OF THE PREFERRED EMBODIMENTS

One aspect of the present invention relates to a radio wave absorber comprising a magnetic powder and a binder, in which a volume filling rate in the magnetic powder in the radio wave absorber is 35% by volume or less, a transmission attenuation amount is 8.0 dB or more, and a reflection attenuation amount is 8.0 dB or more.

In the present invention and the present specification, the "radio wave" means an electromagnetic wave having a frequency of 3 terahertz (THz) or less. The radio wave absorber has radio wave absorbability. The radio wave absorbability can be evaluated, for example, by the transmission attenuation amount and/or the reflection attenuation amount. It can be said that the higher the value of the transmission attenuation amount, the higher the value of the reflection attenuation amount, or the higher the value of the transmission attenuation amount and the value of the reflection attenuation amount, the more excellent the radio wave absorbability.

By the way, in order to improve the recognition accuracy of the radar, it is desirable to increase the directivity of the radar. Furthermore, it is desirable to enhance the selectivity of the radar by removing or reducing unnecessary radio wave components, where the selectivity is receiving radio waves selectively from an object. The radio wave absorber can contribute to the improvement of the directivity of the radar and the removal or reduction of unnecessary radio wave components by setting the transmission attenuation amount and the reflection attenuation amount in the above ranges, respectively. For example, the on-vehicle radar, which has been attracting attention in recent years, is a radar that uses radio waves in the millimeter wave frequency band. The millimeter waves are electromagnetic waves having a frequency of 30 GHz to 300 GHz. The radio wave absorber is a radio wave absorber that exhibits a transmission attenuation amount of 8.0 dB or more and a reflection attenuation amount of 8.0 dB or more with respect to a frequency band of the radio wave, that is, one or more frequencies in the frequency band of 3 terahertz (THz) or less. From the viewpoint of usefulness for improving the recognition accuracy of the on-vehicle radar, the frequency at which a transmission attenuation amount of 8.0 dB or more and a reflection attenuation amount of 8.0 dB or more is exhibited is preferably a millimeter wave frequency band, that is, one or more frequencies in the frequency band of 30 GHz to 300 GHz, more preferably one or more frequencies in the frequency band of 60 GHz to 90 GHz, and still more preferably one or more frequencies in the frequency band of 75 GHz to 85 GHz. As an example, the radio wave absorber can be a radio wave absorber having a transmission attenuation amount of 8.0 dB or more at a frequency of 76.5 GHz and a reflection attenuation amount of 8.0 dB or more at a frequency of 76.5 GHz. Such a radio wave absorber is suitable as a radio wave absorber that is incorporated on a front side (an incident side of the radio wave incident from the outside) of the radio wave transmitting and receiving unit in the on-vehicle radar in order to reduce the side lobe of the on-vehicle millimeter-wave radar.

In the present invention and the present specification, the "powder" means an aggregation of a plurality of particles. The "aggregation" is not limited to an aspect in which particles that constitute an aggregation are in direct contact with each other, and also includes an aspect in which a binder or the like is interposed between the particles.

[Transmission Attenuation Amount and Reflection Attenuation Amount]

The transmission attenuation amount of the radio wave absorber is 8.0 dB or more. In order to improve the recognition accuracy of the radar, it is desirable to increase the directivity of the radar. A transmission attenuation amount of 8.0 dB or more is capable of contributing to the improvement of the directivity of the radar. From the viewpoint of further improving the directivity of the radar, the transmission attenuation amount of the radio wave absorber is preferably 8.5 dB or more, more preferably 9.0 dB or more, still more preferably 10.0 dB or more, even still more preferably 10.5 dB or more, and even further still more preferably 11.0 dB or more. The transmission attenuation amount of the radio wave absorber can be, for example, 15.0 dB or less, 14.5 dB or less, 14.0 dB or less, 13.5 dB or less, 13.0 dB or less, 12.5 dB or less, or 12.0 dB or less. However, from the viewpoint of improving the directivity of the radar, it is preferable that the transmission attenuation amount of the radio wave absorber is high. Accordingly, the transmission attenuation amount of the radio wave absorber may exceed the values exemplified above.

Further, the reflection attenuation amount of the radio wave absorber is 8.0 dB or more. In order to improve the recognition accuracy of the radar, it is desirable to enhance the selectivity of the radar by removing or reducing unnecessary radio wave components with the radio wave absorber, where the selectivity is receiving radio waves selectively from an object. A reflection attenuation amount of 8.0 dB or more can contribute to the removal or reduction of unnecessary radio wave components. From this point, the reflection attenuation amount of the radio wave absorber is preferably 8.5 dB or more, more preferably 9.0 dB or more, still more preferably 10.0 dB or more, even still more preferably 10.5 dB or more, and even further still more preferably 11.0 dB or more. The reflection attenuation amount of the radio wave absorber can be, for example, 18.0 dB or less, 17.5 dB or less, 17.0 dB or less, 16.5 dB or less, 16.0 dB or less, 15.5 dB or less, or 15.0 dB or less. However, from the viewpoint of removing or reducing unnecessary radio wave components, it is preferable that the reflection attenuation amount of the radio wave absorber is high. Accordingly, the reflection attenuation amount of the radio wave absorber may exceed the values exemplified above.

The "transmission attenuation amount" in the present invention and the present specification is a value obtained by measuring an S parameter in a measurement environment at an ambient temperature of 15° C. to 35° C. with a free space method by setting an incidence angle of 0° and being determined as S21 of the S parameter. The "reflection attenuation amount" is a value determined as S11 of the S parameter by the same measurement. The measurement can be carried out using a known vector network analyzer and horn antenna. Examples of the specific example of the measurement method include the methods described in Examples described later.

By the way, in a radio wave absorber, a metal layer may be laminated on a surface (a so-called back surface) opposite to the surface on which radio waves are incident on the radio wave absorber. Such a radio wave absorber is called a matching-type radio wave absorber. In the matching-type radio wave absorber, reflection attenuation characteristics can be enhanced by providing a metal layer to utilize the phase difference absorption. On the other hand, in the radio wave absorber, the radio wave absorber itself has excellent reflection attenuation characteristics. Specifically, it is possible to exhibit a reflection attenuation amount of 8.0 dB or more regardless of the metal layer. A radio wave absorber that is used without laminating a metal layer on the back surface is generally called a transmission-type radio wave absorber. In the conventional transmission-type radio wave absorber containing a magnetic powder and a binder, in general, the reflection attenuation amount tended to decrease in a case where an attempt was made to increase the transmission attenuation amount. On the other hand, the radio wave absorber can exhibit a reflection attenuation amount of 8.0 dB or more and a transmission attenuation amount of 8.0 dB or more regardless of the metal layer.

The "metal layer" described in the present specification means a layer containing a metal and substantially reflecting radio waves. However, in a case where the radio wave absorber containing a magnetic powder and a binder contains a metal, such a radio wave absorber does not correspond to the metal layer. Here, "substantially reflecting radio waves" means, for example, reflecting 90% or more of incident radio waves in a case where the radio waves are incident on the radio wave absorber in a state where a metal layer is laminated on the back surface of the radio wave absorber. Examples of the form of the metal layer include a metal plate and a metal foil. For example, a metal layer formed on the back surface of the radio wave absorber by vapor deposition can be mentioned. The radio wave absorber can be used without a metal layer being provided on the back surface. The fact that the radio wave absorber can be used without a metal layer is preferable from the viewpoint of recycling and the viewpoint of cost. In addition, the quality of the radio wave absorber that is used by laminating a metal layer on the back surface may deteriorate due to the deterioration of the metal layer, the peeling of the metal layer from the radio wave absorber, and the like. The fact that it can be used without a metal layer being provided on the back surface is also preferable in that such quality deterioration does not occur.

[Volume Filling Rate of Magnetic Powder]

The radio wave absorber contains a magnetic powder and a binder. The proportion of the magnetic powder in the radio wave absorber is 35% by volume or less as the volume filling rate. The volume filling rate of the magnetic powder in the radio wave absorber of 35% by volume or less can mainly contribute to being capable of allowing the reflection attenuation amount of the radio wave absorber to be 8.0 dB or more regardless of the metal layer. From the viewpoint of further improving the reflection attenuation characteristics of the radio wave absorber, the volume filling rate of the magnetic powder is preferably 33% by volume or less, more preferably 30% by volume or less, still more preferably 28% by volume or less and even still more preferably 25% by volume or less. On the other hand, the transmission attenuation amount can be controlled by the proportion of the magnetic powder in the radio wave absorber, the thickness of the radio wave absorber, the kind of the magnetic powder, and the like. From the viewpoint of controlling the transmission attenuation amount, the volume filling rate of the magnetic powder is preferably 10% by volume or more, more preferably 12% by volume or more, and still more preferably 15% by volume or more.

The volume filling rate described above means a volume-based content with respect to 100% by volume of the total volume of the radio wave absorber. The volume filling rate of the magnetic powder in the radio wave absorber can be determined by the following method using a cross-section SEM image acquired by a scanning electron microscope (SEM).

A measurement sample having a square plane, one side of which has a length of 5 mm, is cut out from a randomly determined position of the radio wave absorber to be measured. A sample for cross-section observation is prepared from the cut-out sample. The sample for cross-section observation is prepared by focused ion beam (FIB) processing. The prepared cross-section observation sample is observed by SEM, and a cross-section image (SEM image) is taken. As the SEM, a field emission scanning electron microscope (FE-SEM) is used. Using the FE-SEM, a cross-section observation sample is set on a stage so that the FIB-processed cross-section faces upward, and a cross-section SEM image with a visual field of 30 μm×40 μm is obtained under the conditions of an acceleration voltage of 15 kV and an observation magnification of 3,000 folds. The obtained cross-section SEM image is subjected to binarization processing, and the proportion (in terms of the area) of the magnetic powder is calculated.

The above operation is carried out on five measurement samples cut out from different positions of the radio wave absorber to be measured, and the volume filling rate of the magnetic powder can be determined as the arithmetic mean of the obtained five values. As necessary, the elemental analysis of the cross-section observation sample is carried out to specify the portion of the magnetic powder in the cross-section SEM image.

In addition, for example, the magnetic powder is collected from the radio wave absorber by a known method, and the volume filling rate of the magnetic material in the radio wave absorber can be determined as "(the volume of the collected magnetic powder/the total volume of the radio wave absorber)×100". Here, the total volume of the radio wave absorber and the volume of the magnetic powder can be determined by a known method. Alternatively, in a case where the composition of a composition for forming a radio wave absorber used for preparing a radio wave absorber is known, the volume filling rate of the magnetic powder in the radio wave absorber can be determined from this known composition.

The volume filling rates of the other components described in the present specification can also be determined in the same manner as described above.

[Magnetic Powder]

Examples of the magnetic powder contained in the radio wave absorber include powders of various magnetic materials such as ferrite, iron oxide, cobalt, and chromium oxide. The radio wave absorber may contain only one kind of magnetic powder or may contain two or more different kinds of magnetic powders in any ratio. From the viewpoint of radio wave absorption performance, the magnetic powder is preferably a powder of a hexagonal ferrite or a powder of ε-iron oxide. The kind of the magnetic material constituting the magnetic powder contained in the radio wave absorber can be checked by extracting the magnetic powder from the radio wave absorber by a known method and carrying out X-ray diffraction analysis on the extracted magnetic powder. Alternatively, it can be checked by, for example, the following method. A part or all of the radio wave absorber is finely chopped, immersed in a solvent (for example, acetone) for 1 or 2 days, and then dried. The dried radio wave absorber is further ground finely and subjected to X-ray diffraction analysis.

<Powder of Hexagonal Ferrite>

In the present invention and the present specification, the "powder of a hexagonal ferrite" refers to a magnetic powder in which a hexagonal ferrite-type crystal structure is detected as the main phase by X-ray diffraction analysis. The main phase refers to a structure to which the highest intensity diffraction peak attributes in the X-ray diffraction spectrum obtained by X-ray diffraction analysis. For example, in a case where the highest intensity diffraction peak in the X-ray diffraction spectrum obtained by X-ray diffraction analysis attributes to the hexagonal ferrite-type crystal structure, it is determined that the hexagonal ferrite-type crystal structure is detected as the main phase. In a case where only a single structure is detected by X-ray diffraction analysis, this detected structure is used as the main phase. The hexagonal ferrite-type crystal structure contains at least an iron atom, a divalent metal atom, and an oxygen atom as constituent atoms. The divalent metal atom is a metal atom that is capable of being a divalent cation, as an ion, and examples thereof include an alkaline earth metal atom such as a strontium atom, a barium atom, or a calcium atom, and a lead atom. In the present invention and the present specification, the hexagonal strontium ferrite powder means one in which the main divalent metal atom contained in this powder is a strontium atom, and the hexagonal barium ferrite powder means one in which the main divalent metal atom contained in this powder is a barium atom. The main divalent metal atom means a divalent metal atom that occupies the largest amount among the divalent metal atoms contained in this powder based on the % by atom. However, rare earth atoms are not included in the above divalent metal atoms. The "rare earth atom" in the present invention and the present specification is selected from the group consisting of a scandium atom (Sc), a yttrium atom (Y), and a lanthanoid atom. The lanthanoid atom is selected from the group consisting of a lanthanum atom (La), a cerium atom (Ce), a praseodymium atom (Pr), a neodymium atom (Nd), a promethium atom (Pm), a samarium atom (Sm), a europium atom (Eu), a gadolinium atom (Gd), a terbium atom (Tb), a dysprosium atom (Dy), a holmium atom (Ho), an erbium atom (Er), a thulium atom (Tm), a ytterbium atom (Yb), and a lutetium atom (Lu).

In one aspect, the powder of a hexagonal ferrite contained in the radio wave absorber can be a magnetoplumbite-type (generally referred to as an "M-type") powder of a hexagonal ferrite. The magnetoplumbite-type hexagonal ferrite has a composition represented by a composition formula: $AFe_{12}O_{19}$ in a case where it does not contain an atom that substitutes iron. Here, A can represent at least one kind of atom selected from the group consisting of Sr, Ba, Ca, and Pb, and also includes an aspect in which two or more of these atoms are contained in any ratio.

Examples of the hexagonal ferrite preferable from the viewpoint of radio wave absorption performance include a substitution-type magnetoplumbite-type hexagonal ferrite in which a part of iron atoms of the magnetoplumbite-type hexagonal ferrite is substituted with an aluminum atom. As one aspect of such hexagonal ferrite, hexagonal ferrite having a composition represented by Formula 1 can be mentioned.

$$AFe_{(12-x)}Al_xO_{19} \quad \text{Formula 1}$$

In Formula 1, A represents at least one kind of atom (hereinafter, also referred to as an "A atom") selected from the group consisting of Sr, Ba, Ca, and Pb, it may be only one kind of atom, it may contain two or more kinds of atoms in any ratio, and, from the viewpoint of improving the uniformity of the composition between particles that constitute the powder, it is preferably only one kind of atom.

From the viewpoint of radio wave absorbability in the high frequency band, A in Formula 1 is preferably at least one kind of atom selected from the group consisting of Sr, Ba, and Ca, and more preferably Sr.

In Formula 1, x satisfies $1.50 \leq x \leq 8.00$. From the viewpoint of radio wave absorbability in the high frequency band, x is 1.50 or more, more preferably more than 1.50, still more preferably 2.00 or more, and even still more preferably more than 2.00. In addition, from the viewpoint of magnetic properties, x is 8.00 or less, preferably less than 8.00, more preferably 6.00 or less, and still more preferably less than 6.00.

Specific examples of the magnetoplumbite-type hexagonal ferrite represented by Formula 1 include $SrFe_{(9.58)}Al_{(2.42)}O_{19}$, $SrFe_{(9.37)}Al_{(2.63)}O_{19}$, $SrFe_{(9.27)}Al_{(2.73)}O_{19}$, $SrFe_{(9.85)}Al_{(2.15)}O_{19}$, $SrFe_{(10.00)}Al_{(2.00)}O_{19}$, $SrFe_{(9.74)}Al_{(2.26)}O_{19}$, $SrFe_{(10.44)}Al_{(1.56)}O_{19}$, $SrFe_{(9.79)}Al_{(2.21)}O_{19}$, $SrFe_{(9.33)}Al_{(2.67)}O_{19}$, $SrFe_{(7.88)}Al_{(4.12)}O_{19}$, $SrFe_{(7.04)}Al_{(4.96)}O_{19}$, $SrFe_{(7.37)}Al_{(4.63)}O_{19}$, $SrFe_{(6.25)}Al_{(5.75)}O_{19}$, $SrFe_{(7.71)}Al_{(4.29)}O_{19}$, $Sr_{(0.80)}Ba_{(0.10)}Ca_{(0.10)}Fe_{(9.83)}Al_{(2.17)}O_{19}$, $BaFe_{(9.50)}Al_{(2.50)}O_{19}$, $CaFe_{(10.00)}Al_{(2.00)}O_{19}$, and $PbFe_{(9.00)}Al_{(3.00)}O_{19}$. The composition of hexagonal ferrite can be checked by high frequency inductively coupled plasma emission spectroscopy. Specific examples of the checking method include a method described in Examples described later. Alternatively, after exposing a cross-section by cutting the radio wave absorber or the like, the exposed cross-section is subjected to, for example, energy dispersive X-ray analysis, whereby the composition of the magnetic powder contained in the radio wave absorber can be checked.

In one aspect, in the powder of a hexagonal ferrite contained in the radio wave absorber, the crystal phase can be a single crystal phase, and a plurality of crystal phases can be included. It is preferable that the crystal phase is a single phase, and it is more preferable that the powder of a hexagonal ferrite is a powder of a magnetoplumbite-type hexagonal ferrite in which the crystal phase is a single phase.

The case where the "crystal phase is a single phase" refers to a case where only one kind of diffraction pattern showing any crystal structure is observed in the X-ray diffraction analysis. The X-ray diffraction analysis can be carried out, for example, by the method described in Examples described later. In a case where a plurality of crystal phases are included, two or more kinds of diffraction patterns showing any crystal structure are observed in the X-ray diffraction analysis. Regarding the attribution of the diffraction pattern, for example, a database of the International Centre for Diffraction Data (ICDD, registered trade name) can be referenced. For example, regarding the diffraction pattern of the magnetoplumbite-type hexagonal ferrite containing Sr, "00-033-1340" of the International Centre for Diffraction Data (ICDD) can be referred to. However, in a case where a part of iron atoms are substituted with a substituent atom such as an aluminum atom, the peak position shifts from the peak position observed in a case where the substituent atom is not included.

(Method of Producing Powder of Hexagonal Ferrite)

Examples of the method of producing a powder of a hexagonal ferrite include a solid phase method and a liquid phase method. The solid phase method is a method of producing a powder of a hexagonal ferrite by sintering a mixture obtained by mixing a plurality of solid raw materials in a dry-type manner. On the other hand, the liquid phase method includes a step of using a solution. Hereinafter, one aspect of the method of producing a powder of a hexagonal ferrite by the liquid phase method will be described. However, in a case where the radio wave absorber contains a powder of a hexagonal ferrite, the producing method thereof is not limited to the following aspects.

One aspect of the liquid phase method can include;

a step 1 of obtaining a precipitate from a solution containing an iron atom, at least one kind of atom selected from the group consisting of Sr, Ba, Ca, and Pb, and, as necessary, one or more substituent atoms that substitute an iron atom and a step 2 of sintering the precipitate obtained in the step 1 to obtain a sintered product.

Hereinafter, each step will be described in detail.

Step 1

In the step 1, a hexagonal ferrite precursor can be obtained as a precipitate. For example, in order to obtain a powder of a hexagonal ferrite containing an aluminum atom as a substituent atom that substitutes a part of iron atoms, an iron atom, an A atom, and an aluminum atom can be mixed in a solution. In this case, it is presumed that the precipitate obtained in the step 1 is iron hydroxide, aluminum hydroxide, a composite hydroxide of an iron atom, an aluminum atom, and an A atom, and the like.

The solution for obtaining the precipitate in the step 1 is preferably a solution containing at least water and is more preferably an aqueous solution. For example, a precipitate can be generated by mixing an aqueous solution containing various atoms (hereinafter, also referred to as a "raw material aqueous solution") with an alkaline aqueous solution. In addition, the step 1 can include a step of carrying out the solid-liquid separation of the precipitate.

The raw material aqueous solution can be, for example, an aqueous solution containing an Fe salt, an Al salt, and a salt of an A atom. These salts can be, for example, water-soluble inorganic acid salts such as nitrates, sulfates, and chlorides.

Specific examples of the Fe salt include iron (III) chloride hexahydrate [$FeCl_3 \cdot 6H_2O$] and iron (III) nitrate nonahydrate [$Fe(NO_3)_3 \cdot 9H_2O$].

Specific examples of the Al salts include aluminum chloride hexahydrate [$AlCl_3 \cdot 6H_2O$] and aluminum nitrate nonahydrate [$Al(NO_3)_3 \cdot 9H_2O$].

The salt of the A atom can be one or more kinds of salts selected from the group consisting of a Sr salt, a Ba salt, a Ca salt, and a Pb salt.

Specific examples of the Sr salt include strontium chloride hexahydrate [$SrCl_2 \cdot 6H_2O$], strontium nitrate [$Sr(NO_3)_2$], and strontium acetate 0.5 hydrate [$Sr(CH_3COO)_2 \cdot 0.5H_2O$].

Specific examples of the Ba salt include barium chloride dihydrate [$BaCl_2 \cdot 2H_2O$], barium nitrate [$Ba(NO_3)_2$], and barium acetate [$(CH_3COO)_2Ba$].

Specific examples of the Ca salt include calcium chloride dihydrate [$CaCl_2 \cdot 2H_2O$], calcium nitrate tetrahydrate [$Ca(NO_3)_2 \cdot 4H_2O$], and calcium acetate monohydrate [$(CH_3COO)_2Ca \cdot H_2O$].

Specific examples of the Pb salt include lead (II) chloride [$PbCl_2$] and lead (II) nitrate [$Pb(NO_3)_2$].

However, the above is an example, and other salts can be also used. The mixing ratio between various salts for preparing the raw material aqueous solution may be determined depending on the desired hexagonal ferrite composition.

Examples of the alkaline aqueous solution include a sodium hydroxide aqueous solution and a potassium hydroxide aqueous solution. The concentration of the alkaline aqueous solution can be, for example, 0.1 mol/L to 10 mol/L. However, the kind and the concentration of the alkaline aqueous solution are not limited to the above examples as long as the precipitate can be produced.

The raw material aqueous solution and the alkaline aqueous solution may be simply mixed. The whole amount of the raw material aqueous solution and the whole amount of the alkaline aqueous solution may be mixed at one time, or the raw material aqueous solution and the alkaline aqueous solution may be gradually mixed. Alternatively, the mixing may be carried out by mixing while gradually adding one of the raw material aqueous solution and the alkaline aqueous solution to the other. The method of mixing the raw material aqueous solution with the alkaline aqueous solution is not particularly limited, and examples thereof include a method of mixing with stirring. A stirring unit is not particularly limited either, and a general stirring unit can be used. The stirring time may be set to a time during which a precipitate can be formed, and it can be appropriately set depending on the composition of the raw material aqueous solution, the kind of the stirring unit to be used, and the like.

The temperature (the solution temperature) at which the raw material aqueous solution is mixed with the alkaline aqueous solution is, for example, preferably 100° C. or lower from the viewpoint of preventing explosive boil, and more preferably 95° C. or lower and still more preferably 15° C. or higher and 92° C. or lower from the viewpoint of causing the precipitation reaction to proceed well. As a unit for adjusting the temperature, a general heating device, cooling device, or the like can be used. The pH of the aqueous solution obtained by mixing the raw material aqueous solution with the alkaline aqueous solution, at a temperature of 25° C., is, for example, preferably in a range of 5 to 13 and more preferably in a range of 6 to 12 from the viewpoint that a precipitate is more easily obtained.

In a case where the obtained precipitate is subjected to solid-liquid separation after the precipitate is formed, the method of thereof is not particularly limited, and examples thereof include decantation, centrifugation, and filtration (suction filtration, pressure filtration, or the like). For example, in a case where the solid-liquid separation is carried out by centrifugation, the conditions for centrifugation are not particularly limited, and for example, centrifugation can be carried out for 3 to 30 minutes at a rotation speed of 2,000 revolutions per minute (rpm) or more. Further, the centrifugation may be carried out a plurality of times.

Step 2

The step 2 is a step of sintering the precipitate obtained in the step 1. In the step 2, the precursor of hexagonal ferrite can be converted to hexagonal ferrite by sintering the precipitate obtained in the step 1. The sintering can be carried out using a heating device. The heating device is not particularly limited, and a known heating device such as an electric furnace, a sintering device manufactured according to a production line, or the like can be used. The sintering can be carried out, for example, in an ambient air atmosphere. The sintering temperature and the sintering time may be set within a range in which the precursor of hexagonal ferrite can be converted to hexagonal ferrite. The sintering temperature is, for example, preferably 900° C. or higher, more preferably in a range of 900° C. to 1,400° C., and still more preferably in a range of 1,000° C. to 1,200° C. The sintering time is, for example, preferably in a range of 1 hour to 10 hours and more preferably in a range of 2 hours to 6 hours. In addition, the precipitate obtained in the step 1 can be dried before sintering. The drying unit is not particularly limited, and examples thereof include a dryer such as an oven. The drying temperature is, for example, preferably in a range of 50° C. to 200° C. and more preferably in a range of 70° C. to 150° C. The drying time is, for example, preferably in a range of 2 hours to 50 hours and more preferably in a range of 5 hours to 30 hours. The above sintering temperature and drying temperature can be the internal ambient temperature of the device for sintering or drying.

The sintered product obtained in the above step 2 can be an aggregated sintered product or a powder-shaped sintered product, in which the precursor of hexagonal ferrite is converted to show the crystal structure of hexagonal ferrite. Further, a step of pulverizing the sintered product can also be carried out. The pulverization can be carried out with a known pulverizing unit such as a mortar and pestle or a pulverizer (a cutter mill, a ball mill, a bead mill, a roller mill, a jet mill, a hammer mill, an attritor, or the like). For example, in the case of pulverizing using a medium, a particle size of the medium (a so-called medium diameter) is, for example, preferably in a range of 0.1 mm to 5.0 mm and more preferably in a range of 0.5 mm to 3.0 mm. The "medium diameter" in a case of a spherical medium means an arithmetic mean of diameters of a plurality of randomly selected media (for example, beads). In a case of a non-spherical medium (for example, a non-spherical bead), it means an arithmetic mean of equivalent circle diameters of a plurality of randomly selected media, which is determined from an observation image obtained from a transmission electron microscope (TEM) or a scanning electron microscope (SEM). Examples of the medium material include glass, alumina, steel, zirconia, and ceramics. In a case of pulverizing with a cutter mill, the pulverizing conditions can be determined depending on the amount of the sintered product to be pulverized, the scale of the cutter mill to be used, and the like. For example, in one aspect, the rotation speed of the cutter mill can be about 5,000 to 25,000 rpm.

<Powder of F-Iron Oxide>

In the present invention and the present specification, the "powder of ε-iron oxide" refers to a powder of a magnetic material in which an ε-iron oxide-type crystal structure is detected as the main phase by X-ray diffraction analysis. For example, in a case where the highest intensity diffraction peak in the X-ray diffraction spectrum obtained by X-ray diffraction analysis attributes to the ε-iron oxide-type crystal structure, it is determined that the ε-iron oxide-type crystal structure is detected as the main phase. The powder of ε-iron oxide in the present invention and the present specification includes a powder of a so-called unsubstitution-type ε-iron oxide composed of an iron atom and an oxygen atom, and a powder of a so-called substitution-type ε-iron oxide containing one or more kinds of substituent atoms that substitute an iron atom.

(Method of Producing Powder of F-Iron Oxide)

As the method of producing a powder of ε-iron oxide, a method of preparing a powder from goethite, a reverse micelle method, and the like are known. All of the above producing methods are known. In addition, regarding the method of producing a powder of ε-iron oxide in which a part of Fe is substituted with a substituent atom such as Ga, Co, Ti, Al, or Rh, for example, J. Jpn. Soc. Powder Metallurgy Vol. 61 Supplement, No. S1, pp. S280-S284, J. Mater. Chem. C, 2013, 1, pp. 5200-5206 and the like can be referenced.

As an example, a powder of ε-iron oxide can be obtained by, for example, a producing method of a powder of ε-iron oxide through the following steps;

preparing a precursor of ε-iron oxide (hereinafter, also described as a "precursor preparation step"), subjecting the precursor to a coating film forming treatment (hereinafter, also described as a "coating film forming step"), subjecting the precursor after the coating film forming treatment to heat treatment to convert the precursor to ε-iron oxide (hereinafter, also described as a "heat treatment step"), and subjecting the ε-iron oxide to coating film removing treatment (hereinafter, also described as a "coating film removing step").

The producing method will be further described below. However, the producing method described below is an example, and in a case where the radio wave absorber contains a powder of ε-iron oxide, the powder is not limited to a powder produced by the producing method exemplified below.

(Precursor Preparation Step)

The precursor of ε-iron oxide refers to a substance that contains an ε-iron oxide-type crystal structure as a main phase in a case of being heated. The precursor can be, for example, a hydroxide or an oxyhydroxide (an oxide hydroxide), which contains iron and a hydroxide containing an atom capable of substituting a part of iron in the crystal structure. The precursor preparation step can be carried out by using a coprecipitation method, a reverse micelle method, or the like. A method of preparing such a precursor is known, and the precursor preparation step in the above-described producing method can be carried out by a known method.

ε-iron oxide, which does not contain a substituent atom that substitutes a part of iron atoms, can be represented by a composition formula: $Fe_2O_3$. On the other hand, ε-iron oxide in which a part of iron atoms are substituted with, for example, one to three kinds of atoms can be represented by a composition formula: $A^1_xA^2_yA^3_zFe_{(2-x-y-z)}O_3$. $A^1$, $A^2$, and $A^3$ each independently represent a substituent atom that substitutes an iron atom, and x, y, and z are each independently equal to or more than 0 and less than 1, where at least one thereof is more than 0 and x+y+z is less than 2. The powder of ε-iron oxide may contain or may not contain a substituent atom that substitutes an iron atom. The magnetic properties of the powder of ε-iron oxide can be adjusted by the kind and the substitution amount of the substituent atom. In a case where a substituent atom is contained, examples of the substituent atom include one or more of Ga, Co, Ti, Al, Rh, and the like, and one or more of Ga, Co, and Ti are preferable. In a case of producing a powder of an ε-iron oxide containing a substituent atom that substitutes an iron atom, a part of the compound that is a source of Fe in ε-iron oxide may be replaced with a compound of the substituent atom. The composition of the obtained powder of ε-iron oxide can be controlled by the substitution amount. Examples of the compound that is a source of an iron atom and various substituent atoms include an inorganic salt (it may be a hydrate) such as a nitrate, a sulfate, or a chloride, an organic salt (it may be a hydrate) such as a pentakis (hydrogen oxalate) salt, a hydroxide, and an oxyhydroxide.

(Coating Film Forming Step)

In a case where the precursor is heated after the coating film forming treatment, the reaction of converting the precursor to ε-iron oxide can be allowed to proceed under the coating film. It is also conceived that the coating film can also play a role in preventing the occurrence of sintering during heating. From the viewpoint of easiness of the coating film formation, the coating film forming treatment is preferably carried out in a solution and more preferably carried out by adding a coating film forming agent (a compound for coating film formation) to a solution containing the precursor. For example, in a case where the coating film forming treatment is carried out in the same solution following the precursor preparation, a coating film forming agent can be added to the solution after the precursor preparation and stirred to form a coating film on the precursor. Examples of the coating film that is preferred in that a coating film can be easily formed on a precursor in a solution include a silicon-containing coating film. Examples of the coating film forming agent for forming a silicon-containing coating film include a silane compound such as an alkoxysilane. The silicon-containing coating film can be formed on the precursor by hydrolysis of the silane compound and preferably utilizing a sol-gel method. Specific examples of the silane compound include tetraethoxysilane (tetraethyl orthosilicate (TEOS)), tetramethoxysilane, and various silane coupling agents. For example, the coating film forming treatment can be carried out by stirring a solution that contains a precursor and a coating film forming agent and has a solution temperature of 50° C. to 90° C. for about 5 to 36 hours. The coating film may cover the entire surface of the precursor, or a part of the surface of the precursor may not be covered by the coating film.

(Heat Treatment Step)

In a case where the precursor after the coating film forming treatment is subjected to heat treatment, the precursor can be converted to ε-iron oxide. The heat treatment can be carried out on, for example, a powder (a precursor powder having a coating film) collected from a solution that has undergone the coating film forming treatment. The heat treatment step can be carried out, for example, in a heat treatment furnace having a furnace temperature of 900° C. to 1,200° C. for about 3 to 6 hours.

(Coating Film Removing Step)

In a case of being subjected to the above heat treatment step, the precursor having a coating film is converted to ε-iron oxide. Since the coating film remains on the ε-iron oxide obtained in this manner, a coating film removing treatment is preferably carried out. The coating film removing treatment can be carried out, for example, by stirring ε-iron oxide having a coating film in a sodium hydroxide aqueous solution having a concentration of about 4 mol/L and a solution temperature of about 60° C. to 90° C. for 5 to 36 hours. However, the powder of ε-iron oxide may be a powder produced without undergoing the coating film removing treatment, that is, a powder having a coating film. In addition, the coating film may not be completely removed in the coating film removing treatment, and a part of the coating film may remain in the powder.

A known step can be optionally carried out before and/or after the various steps described above. Examples of such a step include various known steps such as filtration, washing, and drying.

The shape of the particle that constitutes the magnetic powder is not particularly limited, and examples thereof include a spherical shape, a rod shape, a needle shape, a plate shape, and an irregular shape. Examples of the shape of the particle that constitutes the powder of a magnetoplumbite-type hexagonal ferrite include a plate shape, and an irregular shape, and examples of the shape of the particle that constitutes the powder of ε-iron oxide include a spherical shape.

<Various Physical Properties that Magnetic Powder can Have>

The size of the particle that constitutes the magnetic powder contained in the radio wave absorber is not particularly limited. In a case where a mode is denoted by a mode diameter, a 10% cumulative diameter is denoted by $D_{10}$, and a 90% cumulative diameter is denoted by $D_{90}$ in the number-based particle size distribution in the radio wave absorber, which is measured by a laser diffraction and scattering method, the magnetic powder preferably has a mode diameter of 5 μm or more and less than 10 μm. Further, it is more preferable to satisfy $(D_{90}-D_{10})$/mode diameter≤3.0, it is still more preferable to satisfy $(D_{90}-D_{10})$/mode diameter≤2.5, it is even more preferable to satisfy $(D_{90}-D_{10})$/mode diameter≤2.0, it is even still more preferable to satisfy $(D_{90}-D_{10})$/mode diameter≤1.5, and it is even further still more preferable to satisfy $(D_{90}-D_{10})$/mode diameter≤1.0. Since the magnetic powder that has a mode diameter of 5 μm or more and satisfies $(D_{90}-D_{10})$/mode diameter≤3.0 has a relatively small number of fine particles, a radio wave absorber more excellent in radio wave absorption performance tends to be produced by using such a magnetic powder. Since the magnetic powder that has a mode diameter of less than 10 μm and satisfies $(D_{90}-D_{10})$/mode diameter≤3.0 has a relatively small number of coarse particles, a radio wave absorber more excellent in strength tends to be produced by using such a magnetic powder.

The particle size of the magnetic powder (that is, the mode diameter, $D_{10}$, and $D_{90}$) can be controlled by carrying out, for example, classification with a sieve, a centrifuge, or the like, or pulverization with a mortar and pestle, an ultrasonic disperser, or the like. For example, in a case of being controlled by pulverization, the particle size of the magnetic powder can be adjusted by selecting the pulverizing unit, the pulverizing time, the medium material, the medium diameter, or the like. For example, as the pulverizing time becomes long, the particle size of the magnetic powder tends to be small. Further, for example, as the medium diameter becomes small, the particle size of the magnetic powder tends to be small. The value of "$(D_{90}-D_{10})$/mode diameter" can be adjusted, for example, by sorting the particles by classification using a sieve, a centrifuge, or the like after pulverization.

The particle size of the magnetic powder are values determined based on the number-based particle size distribution measured by the laser diffraction and scattering method.

Specifically, it can be measured by the following method. 500 mL of cyclohexanone is added to 10 mg of a magnetic powder and diluted, stirred using a shaker for 30 seconds, and the obtained liquid is used as a sample for particle size distribution measurement. Then, the particle size distribution is measured by the laser diffraction and scattering method using the sample for particle size distribution measurement. A laser diffraction/scattering-type particle size distribution analyzer is used as the measurement device.

The particle size of the magnetic powder contained in the radio wave absorber can be checked by, for example, the following method.

After a radio wave absorber is finely chopped, it is ultrasonically dispersed in a solvent (for example, acetone). The obtained dispersion liquid is used as a sample, and the particle size of the magnetic powder can be checked by carrying out the measurement using a laser diffraction and scattering method.

In addition, regarding the magnetic properties of the magnetic powder contained in the radio wave absorber, the magnetic field strength Ha which is 90% of the magnetization quantity obtained in a case where an external magnetic field of 50 kOe is applied is preferably 19.0 kOe or more and 28.0 kOe or less from the viewpoint of radio wave absorption performance. The magnetic field strength Ha is more preferably 20.0 kOe or more, still more preferably 21.0 kOe or more, and even still more preferably 22.0 kOe or more, from the viewpoint of further improving the radio wave absorption performance. In addition, from the same viewpoint as above, the magnetic field strength Ha is more preferably 27.0 kOe or less, still more preferably 26.0 kOe or less, and even still more preferably 25.0 kOe or less. The magnetic field strength Ha of the magnetic powder can be adjusted by the composition of the magnetic material constituting the magnetic powder, the producing method, and the like.

The magnetic field strength Ha is a value obtained by the following method.

Using an oscillating sample magnetometer, the intensity of magnetization of the magnetic powder is measured with respect to an applied magnetic field under the conditions of a maximum applied magnetic field of 50 kOe and a magnetic field sweep rate of 25 Oe/s (where "s" indicates "second") in an environment with an ambient temperature of 23° C. Then, based on the measurement result, a magnetic field (H)–magnetization (M) curve of the powder is obtained. Based on the obtained magnetic field (H)–magnetization (M) curve, a magnetic field strength which corresponds to 90% of a magnetization quantity at an applied magnetic field of 50 kOe is obtained, which is denoted by the magnetic field strength Ha. The unit thereof is 1 kOe=$(10^6/4\pi)$ A/m.

The coercive force (Hc) of the magnetic powder contained in the radio wave absorber is not particularly limited. From the viewpoint of radio wave absorption performance, the coercive force (Hc) of the magnetic powder is, for example, preferably 2.5 kOe or more, more preferably 4.0 kOe or more, and still more preferably 5.0 kOe or more. The upper limit of the coercive force (Hc) of the magnetic powder is not particularly limited and can be, for example, preferably 18.0 kOe or less.

The saturation magnetization (δs) per unit mass of the magnetic powder contained in the radio wave absorber is not particularly limited. From the viewpoint of radio wave absorption performance, the saturation magnetization (δs) of the magnetic powder is, for example, preferably 10.0 emu/g or more, more preferably 20.0 emu/g or more, and still more preferably 30.0 emu/g or more. The units thereof is 1 emu/g=1 A·m$^2$/kg.

The upper limit of the saturation magnetization (δs) per unit mass of the magnetic powder is not particularly limited and can be, for example, preferably 60.0 emu/g or less. The above-described coercive force (Hc) and saturation magnetization (δs) per unit mass of the magnetic powder are values measured using an oscillating sample magnetometer in an environment of an ambient temperature of 23° C. and conditions of a maximum applied magnetic field of 50 kOe and a magnetic field sweep rate of 25 Oe/s.

In one aspect, the magnetic powder contained in the radio wave absorber is preferably surface-treated.

According to the surface-treated magnetic powder, it is possible to realize a radio wave absorber having excellent radio wave absorption performance, particularly, having an excellent balance between the reflection attenuation amount and the transmission attenuation amount. According to the surface-treated magnetic powder, in particular, it is possible to increase the peak attenuation amount of reflection of the radio wave absorber.

Further, in a case where the magnetic powder is surface-treated, handleability and workability are not easily impaired even in a case where a large amount of magnetic powder is incorporated in the composition (a so-called composition for forming a radio wave absorber) that is used for forming the radio wave absorber.

Further, in a case where the composition for forming a radio wave absorber contains a magnetic powder that has been surface-treated, the mechanical strength of the radio wave absorber to be formed can be improved.

Although it is not clear why the above-described effects are exhibited by the surface-treated magnetic powder, the inventors of the present invention presume as follows.

In a case where the magnetic powder is surface-treated, the cohesive force between particles that constitute the magnetic powder can be weakened, and thus the cohesion between the particles can be suppressed. In a case where the cohesion of the particles is suppressed, the viscosity of the composition for forming a radio wave absorber is difficult to increase. For this reason, it is conceived that the composition for forming a radio wave absorber exhibits sufficient fluidity even in a case where a large amount of the magnetic powder is contained, and thus the handleability and the workability are not easily impaired.

In addition, in a case where the magnetic powder is surface-treated, the affinity between the magnetic powder and the binder can be enhanced. In a case where the cohesive force between the particles that constitute the magnetic powder can be weakened and/or in a case where the affinity between the magnetic powder and the binder can be enhanced, the powder can be more uniformly dispersed in the binder. For this reason, it is conceived that the variation in the radio wave absorption performance hardly occurs, and a radio wave absorber excellent in mechanical strength can be formed.

In a case where the magnetic powder contained in the radio wave absorber is a surface-treated magnetic powder, a known surface treatment technique can be applied to the surface treatment of the magnetic powder.

Examples of the kinds of surface treatment include an oil treatment with hydrocarbon oil, ester oil, lanolin, or the like; a silicone treatment with dimethylpolysiloxane, methylhydrogenpolysiloxane, methylphenylpolysiloxane, or the like; a fluorine compound treatment with a perfluoroalkyl group-containing ester, perfluoroalkylsilane, a polymer having a perfluoropolyether and a perfluoroalkyl group, or the like; a silane coupling agent treatment with 3-methacryloxypropyltrimethoxysilane, 3-glycidoxypropyltrimethoxysilane, N-2-(aminoethyl)-3-aminopropyltrimethoxysilane, or the like; a titanium coupling agent treatment with isopropyltriisostearoyl titanate, isopropyltris(dioctylpyrophosphate)titanate, or the like; a metal soap treatment; an amino acid treatment with acylglutamic acid or the like; a lecithin treatment with hydrogenated egg yolk lecithin or the like; a polyethylene treatment; a mechanochemical treatment; and a phosphoric acid compound treatment with phosphoric acid, phosphorous acid, a phosphate, a phosphite, or the like.

Among these, a phosphoric acid compound treatment is preferable as the kind of the surface treatment.

In a case where the magnetic powder is subjected to a phosphoric acid compound treatment, it is possible to thickly form a highly polar layer on the surface of the particle that constitutes the magnetic powder.

In a case where a highly polar layer is formed on the surface of the particles, the cohesion due to hydrophobic interaction between the particles can be suppressed, and thus it is possible to more effectively suppress the increase in the viscosity of the composition for forming a radio wave absorber. As a result, in the case of the magnetic powder subjected to the phosphoric acid compound treatment, the decrease in the fluidity of the composition for forming a radio wave absorber due to the incorporation of a large amount of the magnetic powder is difficult to occur, and the handleability and the workability tend to be hardly impaired.

Further, in a case where a highly polar layer is formed on the surface of the particles, not only the cohesion of the particles can be suppressed, but also the affinity between the magnetic powder and the binder can be further enhanced, and thus it is possible to disperse the magnetic powder more uniformly in the binder. Therefore, in the radio wave absorber formed from the composition for forming a radio wave absorber containing the magnetic powder subjected to the phosphoric acid compound treatment, the variation in the radio wave absorption performance hardly occurs, and an excellent mechanical strength is exhibited.

In addition to phosphoric acid, the phosphoric acid compound includes phosphorous acid, hypophosphorous acid, pyrophosphoric acid, a linear polyphosphoric acid, a cyclic metaphosphoric acid, and salts thereof.

In a case where the phosphoric acid compound has a form of a salt, the phosphoric acid compound is preferably a metal salt.

The metal salt is not particularly limited, and examples thereof include an alkali metal salt and an alkaline earth metal salt.

In addition, the phosphoric acid compound may be an ammonium salt.

In the phosphoric acid compound treatment, only one kind of phosphoric acid compound may be used, or two or more kinds thereof may be used.

In the phosphoric acid compound treatment, the phosphoric acid compound is generally mixed with a chelating agent, a neutralizing agent, and the like to be used as the surface treatment agent.

In the phosphoric acid compound treatment, as the surface treatment agent, an aqueous solution containing a phosphoric acid compound which is generally commercially available can also be used.

The phosphoric acid compound treatment of the magnetic powder can be carried out, for example, by mixing the magnetic powder and a surface treatment agent containing a phosphoric acid compound. Conditions such as mixing time and temperature may be appropriately set depending on the intended purpose. In the phosphoric acid compound treatment, an insoluble phosphoric acid compound can be precipitated on the surface of the particle that constitutes the magnetic powder by utilizing the dissociation (the equilibrium) reaction of the phosphoric acid compound.

Regarding the phosphoric acid compound treatment, for example, "Surface Technology", Vol. 61, No. 3, p 216, 2010, or "Surface Technology", Vol. 64, No. 12, p 640, 2013 can be referenced.

Further, as the kind of the surface treatment, a silane coupling agent treatment is also preferable.

The silane coupling agent is preferably a silane coupling agent having a hydrolyzable group.

In the silane coupling agent treatment using a silane coupling agent having a hydrolyzable group, the hydrolyzable group in the silane coupling agent is hydrolyzed by water to become a hydroxy group, and this hydroxy group undergoes a dehydrative condensation reaction with a hydroxy group on the surface of the silica particles, whereby the surface of the particles is modified.

Examples of the hydrolyzable group include an alkoxy group, an acyloxy group, and a halogeno group.

The silane coupling agent may have a hydrophobic group as a functional group.

Examples of the silane coupling agent having a hydrophobic group as a functional group include alkoxysilanes such as methyltrimethoxysilane (MTMS), dimethyldimethoxysilane, phenyltrimethoxysilane, methyltriethoxysilane, dimethyldiethoxysilane, phenyltriethoxysilane, n-propyltrimethoxysilanes, n-propyltriethoxysilane, hexyltrimethoxysilane, hexyltriethoxysilane, and decyltrimethoxysilane; chlorosilanes such as methyltrichlorosilane, dimethyldichlorosilane, trimethylchlorosilane, and phenyltrichlorosilane; and hexamethyldisilazane (HMDS).

Further, the silane coupling agent may have a vinyl group as a functional group.

Examples of the silane coupling agent having a vinyl group as a functional group include alkoxysilanes such as methacryloxypropyltriethoxysilane, methacryloxypropyltrimethoxysilane, methacryloxypropylmethyldiethoxysilane, methacryloxypropylmethyldimethoxysilane, vinyltriethoxysilane, vinyltrimethoxysilane, vinylmethyldimethoxysilane; chlorosilanes such as vinyltrichlorosilane and vinylmethyldichlorosilane; and divinyltetramethyldisilazane.

In the silane coupling agent treatment, only one kind of silane coupling agent may be used, or two or more kinds thereof may be used.

The surface treatment method is not particularly limited, and a known method can be applied.

Examples of the surface treatment method include a method of mixing a magnetic powder and a surface treatment agent using a mixer such as a henschel mixer, a method of spraying a surface treatment agent or the like on particle that constitutes the magnetic powder, and a method of mixing a liquid containing a surface treatment agent or the like, which is obtained by dissolving or dispersing a surface treatment agent or the like in an appropriate solvent, with a magnetic powder, and then removing the solvent.

[Binder]

The radio wave absorber contains a magnetic powder and a binder. The binder can be, for example, a resin, and examples of the resin include a thermoplastic resin and a thermosetting resin.

Examples of the thermoplastic resin include an acrylic resin, polyacetal, polyamide, polyethylene, polypropylene, polyethylene terephthalate, polybutylene terephthalate, polycarbonate, polystyrene, polyphenylene sulfide, polyvinyl chloride, an acrylonitrile butadiene styrene (ABS) resin obtained by copolymerization of acrylonitrile, butadiene, and styrene; and an acrylonitrile styrene (AS) resin obtained by copolymerization of acrylonitrile and styrene.

Examples of the thermosetting resin include a phenol resin, an epoxy resin, a melamine resin, a urea resin, an unsaturated polyester, a diallyl phthalate resin, a urethane resin, and a silicon resin.

The binder can also be rubber. From viewpoints that the mixability with the magnetic powder is good and the radio wave absorber having more excellent durability, weather fastness, and impact resistance can be produced, examples of the rubber include butadiene rubber, isoprene rubber, chloroprene rubber, halogenated butyl rubber, fluororubber, urethane rubber, acrylic rubber (abbreviation: ACM) obtained by copolymerization of an acrylic acid ester (for example, ethyl acrylate, butyl acrylate, or 2-ethylhexyl acrylate) and another monomer, ethylene-propylene rubber obtained by coordination polymerization of ethylene and propylene using a Ziegler catalyst, butyl rubber (abbreviation: IIR) obtained by copolymerization of isobutylene and isoprene, styrene butadiene rubber (abbreviation: SBR) obtained by copolymerization of butadiene and styrene, acrylonitrile butadiene rubber (abbreviation: NBR) obtained by copolymerization of acrylonitrile and butadiene, and silicone rubber.

In a case where the radio wave absorber of the present disclosure contains rubber as the binder, it may contain various additives such as a vulcanizing agent, a vulcanization aid, a softener, and a plasticizer, in addition to the rubber. Examples of the vulcanizing agent include sulfur, an organic sulfur compound, and a metal oxide.

Examples of the binder include a thermoplastic elastomer (TPE). Examples of the thermoplastic elastomer include an olefin-based thermoplastic elastomer (a thermoplastic olefinic elastomer (TPO)), a styrene-based thermoplastic elastomer (a thermoplastic styrenic elastomer (TPS)), an amide-based thermoplastic elastomer (a thermoplastic polyamide elastomer (TPA), and a polyester-based thermoplastic elastomer (a thermoplastic copolyester (TPC)).

The radio wave absorber may include only one kind of binder and may include two or more kinds thereof. The volume filling rate of the binder in the radio wave absorber is not particularly limited, and it is, for example, preferably 65% by volume or more, more preferably 65% by volume or more and 92% by volume or less, and still more preferably 65% by volume or more and 85% by volume or less. In a case where the radio wave absorber contains two or more kinds of binders, the volume filling rate means the total volume filling rate of the two or more kinds of binders. This point also identically applies to the volume filling rates of other components.

[Additive]

The radio wave absorber contains a magnetic powder and a binder, and may optionally contain one or more additives. Examples of the additive include an antioxidant, a light stabilizer, a dispersing agent, a dispersing aid, a fungicide, an antistatic agent, a plasticizer, an impact resistance improver, a crystal nucleating agent, a lubricant, a surfactant, a pigment, a dye, a filler, a mold release agent (fatty acid, a fatty acid metal salt, an oxyfatty acid, a fatty acid ester, an aliphatic partially saponified ester, paraffin, a low molecular weight polyolefin, a fatty acid amide, an alkylenebis fatty acid amide, an aliphatic ketone, a fatty acid lower alcohol ester, a fatty acid polyhydric alcohol ester, a fatty acid polyglycol ester, a modified silicone, and the like), a processing aid, an antifogging agent, a drip inhibitor, and an antibacterial agent. One component of the additive may carry out two or more functions. The radio wave absorber can contain, as the additive, a commercially available product or a product produced by a known method at any filling rate. As a result of the examination by the inventors of the present invention, it has been revealed that the use of a carbon component such as graphite as an additive tends to reduce the reflection attenuation amount of the radio wave absorber. For this reason, it is preferable that the using amount of the carbon component is small in a case where the carbon component is used as an additive, and it is also preferable the carbon component is not used as an additive. In addition, some commercially available products that can be used as a binder contain a carbon component mixed for color adjustment or the like. From the viewpoint of increasing the reflection attenuation amount, it is preferable to use a binder containing a carbon component, in which the proportion of the carbon component is low. It is also preferable to use a binder that does not contain a carbon component. Here, the "carbon component" refers to a component of which carbon atoms account for 90% by atom to 100% by atom of all atoms constituting the component. In one aspect, in the above radio wave absorber, the volume filling rate of the carbon component is preferably in a range of 0% to 2.0% by volume, more preferably in a range of 0% to 1.5% by volume, and still more preferably in a range of 0% to 1.0% by volume.

<Antioxidant>

In one aspect, the radio wave absorber of the present disclosure preferably contains an antioxidant.

The antioxidant is not particularly limited, and a known antioxidant can be used.

Examples of the antioxidant are described in, for example, "Comprehensive Technology for Polymer Stabilization—Mechanism and Application Development —" published by CMC Publishing Co., Ltd., supervised by Yasukazu Okatsu. This description is incorporated in the present specification by reference.

Examples of the kind of the antioxidant include a phenol-based antioxidant, an amine-based antioxidant, a phosphorus-based antioxidant, and a sulfur-based antioxidant.

As the antioxidant, it is preferable to use a phenol-based antioxidant and/or an amine-based antioxidant in combination with a phosphorus-based antioxidant and/or a sulfur-based antioxidant.

Examples of the phenol-based antioxidant include ADEKA STAB AO-20, ADEKA STAB AO-30, ADEKA STAB AO-40, ADEKA STAB AO-50, ADEKA STAB AO-60, ADEKA STAB AO-80, and ADEKA STAB AO-330, manufactured by ADEKA Corporation; and IRGANOX 1010, IRGANOX 1035, IRGANOX 1076, IRGANOX 1098, IRGANOX 1135, IRGANOX 1330, IRGANOX 1726, IRGANOX 245, IRGANOX 259, IRGANOX 3114, and IRGANOX 565, manufactured by BASF Japan Ltd. The above "ADEKA STAB" and "IRGANOX" are both registered trade names.

Examples of the amine-based antioxidants include Sanol LS-770, Sanol LS-765, and Sanol LS-2626, manufactured by Mitsubishi-Chemical Foods Corporation; ADEKA STAB LA-77, ADEKA STAB LA-57, ADEKA STAB LA-52, ADEKA STAB LA-62, ADEKA STAB LA-63, ADEKA STAB LA-67, ADEKA STAB LA-68, and ADEKA STAB LA-72, manufactured by ADEKA Corporation; and TINUVIN 123, TINUVIN 144, TINUVIN 622, TINUVIN 765, and TINUVIN 944, manufactured by BASF Japan Ltd. The above "ADEKA STAB" and "TINUVIN" are both registered trade names.

Further, in the above radio wave absorber, an amine-based compound capable of quenching radicals can also be contained as the antioxidant. Examples of such an amine-based compound include polyethylene glycol bis TEMPO [Sigma-Aldrich Co., LLC] and sebacic acid bis TEMPO. Here, "TEMPO" is an abbreviation for tetramethylpiperidin-1-oxyl.

Examples of the phosphorus-based antioxidant include ADEKA STAB PEP-8, ADEKA STAB PEP-36, ADEKA STAB HP-10, and ADEKA STAB 2112, manufactured by ADEKA Corporation; and IRGAFOS 168 manufactured by BASF Japan Ltd. The above "ADEKA STAB" and "IRGAFOS" are both registered trade names.

Examples of the sulfur-based antioxidant include ADEKA STAB AO-412S and ADEKA STAB AO-503S, manufactured by ADEKA Corporation. The above "ADEKA STAB" is a registered trade name.

Among the above, the phenol-based antioxidant is preferably at least one selected from the group consisting of ADEKA STAB AO-20, ADEKA STAB AO-60, ADEKA STAB AO-80, and IRGANOX 1010, the amine-based antioxidant is preferably ADEKA STAB LA-52, the phosphorus-based antioxidant is preferably ADEKA STAB PEP-36, and the sulfur-based antioxidant is preferably ADEKA STAB AO-412S.

In a case of containing an antioxidant, the above radio wave absorber may contain only one kind of antioxidant or may contain two or more kinds of antioxidants.

In a case where the above radio wave absorber contains an antioxidant, the content of the antioxidant in the radio wave absorber is not particularly limited, and it is, for example, preferably 0.1 parts by mass to 10 parts by mass and more preferably 0.5 parts by mass to 5 parts by mass with respect to 100 parts by mass of the binder from the viewpoint of both suppressing the decomposition of the binder and suppressing the bleeding of the antioxidant.

<Light Stabilizer>

In one aspect, the above radio wave absorber preferably contains a light stabilizer.

Examples of the light stabilizer include a hindered amine light stabilizer (an HALS), an ultraviolet absorbing agent, and a singlet oxygen quencher.

In a case of containing a light stabilizer, the above radio wave absorber may contain only one kind of light stabilizer or may contain two or more kinds of light stabilizers.

The HALS may be a high molecular weight HALS, a low molecular weight HALS, or a combination of a high molecular weight HALS and a low molecular weight HALS. In the present invention and the present specification, the "high molecular weight HALS" means a hindered amine-based light stabilizer having a weight-average molecular weight of more than 1,000. In addition, in the present invention and the present specification, the "low molecular weight HALS" means a hindered amine-based light stabilizer having a molecular weight of 1,000 or less (preferably 900 or less and more preferably 600 to 900).

The weight-average molecular weight (Mw) in the present invention and the present specification is a value measured by gel permeation chromatography (GPC). For the measurement by the gel permeation chromatography (GPC), HLC (registered trade names) —8220GPC [manufactured by Tosoh Corporation] is used as the measurement device, TSKgel (registered trade names) Super HZM-M [4.6 mm (inner diameter (ID))×15 cm, manufactured by Tosoh Corporation], Super HZ4000 [4.6 mm ID×15 cm, manufactured by Tosoh Corporation], Super HZ3000 [4.6 mm ID×15 cm, manufactured by Tosoh Corporation], and Super HZ2000 [4.6 mm ID×15 cm, Tosoh Corporation] are connected one by one in series and used as the column, and tetrahydrofuran (THF) can be used as the eluent.

The measurement conditions are a sample concentration of 0.2% by mass, a flow rate of 0.35 mL/min, a sample injection amount of 10 μL, and a measurement temperature of 40° C., and the detection can be carried out using a differential refractive index (RI) detector.

The calibration curve can be created using "Standard sample TSK standard, polystyrene": "F-40", "F-20", "F-4", "F-1", "A-5000", "A-2500", and "A-1000", manufactured by Tosoh Corporation.

High Molecular Weight HALS

Examples of the high molecular weight HALS include, as an oligomer-type HALS, poly [6-(1,1,3,3-tetramethylbutyl) imino-1,3,5-triazine-2,4-diyl][(2,2,6,6-tetramethyl-4-piperidyl)imino]hexamethylene [(2,2,6,6-tetramethyl-4-piperidyl)imino] and dimethyl succinate-1-(2-hydroxyethyl)-4-hydroxy-2,2,6,6-tetramethylpiperidine polycondensate.

Examples of the commercially available high molecular weight HALS product include CHIMASSORB 944LD and TINUVIN 622LD, manufactured by BASF Japan Ltd. The above "CHIMASSORB" and "TINUVIN" are both registered trade names.

In a case where the above radio wave absorber contains a high molecular weight HALS, the content of the high molecular weight HALS in the radio wave absorber is not particularly limited, and it is, for example, preferably 0.2% by mass to 10% by mass with respect to the total mass of the radio wave absorber.

It is preferable that the content of the high molecular weight HALS in the above radio wave absorber is 0.2% by mass or more with respect to the total mass of the radio wave absorber from the viewpoint of improving weather fastness.

In a case where the content of the high molecular weight HALS in the above radio wave absorber is 10% by mass or less with respect to the total mass of the radio wave absorber, the decrease in mechanical strength and the occurrence of blooming tend to be further suppressed.

Low Molecular Weight HALS

Examples of the low molecular weight HALS include tris(2,2,6,6-tetramethyl-4-piperidyl)benzene-1,3,5-tricarboxylate, tris(2,2,6,6-tetramethyl-4-piperidyl)-2-acetoxypropane-1,2,3-tricarboxylate, tris(2,2,6,6-tetramethyl-4-piperidyl)-2-hydroxypropane-1,2,3-tricarboxylate, tris(2,2,6,6-tetramethyl-4-piperidyl)triazine-2,4,6-tricarboxylate, tris(2,2,6,6-tetramethyl-4-piperidyl)butane-1,2,3-tricarboxylate, tetrakis(2,2,6,6-tetramethyl-4-piperidyl)propane-1,1,2,3-tetracarboxylate, tetrakis(2,2,6,6-tetramethyl-4-piperidyl) 1,2,3,4-butanetetracarboxylate, tetrakis(1,2,2,6,6-pentamethyl-4-piperidyl) 1,2,3,4-butanetetracarboxylate, and 2-(3,5-di-t-butyl-4-hydroxybenzyl)-2-n-butylmalonate bis(1,2,2,6,6-pentamethyl-4-piperidyl).

Examples of the commercially available low molecular weight HALS product include ADEKA STAB LA-57, and ADEKA STAB LA-52, manufactured by ADEKA Corporation; and TINUVIN 144 manufactured by BASF Japan Ltd. The above "ADEKA STAB" and "TINUVIN" are both registered trade names.

In a case where the above radio wave absorber contains a low molecular weight HALS, the content of the low molecular weight HALS in the radio wave absorber is not particularly limited; however, it is, for example, preferably 0.2% by mass to 10% by mass with respect to the total mass of the radio wave absorber.

It is preferable that the content of the low molecular weight HALS in the above radio wave absorber is 0.2% by mass or more with respect to the total mass of the radio wave absorber from the viewpoint of improving weather fastness.

In a case where the content of the low molecular weight HALS in the above radio wave absorber is 10% by mass or less with respect to the total mass of the radio wave absorber, the decrease in mechanical strength and the occurrence of blooming tend to be further suppressed.

Ultraviolet Absorbing Agent

Examples of the ultraviolet absorbing agent include benzotriazole-based ultraviolet absorbing agents such as 2-(2'-hydroxy-3',5'-di-t-butylphenyl)benzotriazole, 2-(3,5-di-t-amyl-2-hydroxyphenyl)benzotriazole, 2-(2'-hydroxy-5'-methyl-phenyl)benzotriazole, 2-(2'-hydroxy-5'-t-octylphenyl)benzotriazole, 2-(2'-hydroxy-3',5'-di-t-amylphenyl)benzotriazole, 2-[2'-hydroxy-3'-(3",4",5",6"-tetrahydrophthalimidemethyl)-5'-methylphenyl]benzotriazole, 2,2'-methylenebis [4-(1,1,3,3-tetramethylbutyl)-6-(2H-benzotriazole-2-yl)phenol], 2-[2-hydroxy-3,5-bis(α,α-dimethylbenzyl)phenyl]-2H-benzotriazole, 2-(2-hydroxy-4-octyloxyphenyl)-2H-benzotriazole, and 2-(2H-benzotriazole-2-yl)-4-methyl-6-(3,4,5,6-tetrahydrophthalimidylmethyl)phenol; benzophenone-based ultraviolet absorbing agents such as 2-hydroxy-4-methoxybenzophenone, 2,4-dihydroxybenzophenone, 2,2'-dihydroxy-4-methoxybenzophenone, 2,2'-dihydroxy-4,4'-dimethoxybenzophenone, 2-hydroxy-4-n-octoxybenzophenone, 2,2',4,4'-tetrahydroxybenzophenone, 4-dodecyloxy-2-hydroxybenzophenone, a 3,5-di-t-butyl-4-(hydroxybenzoyl)benzoic acid n-hexadecyl ester, 1,4-bis(4-benzoyl-3-hydroxyphenoxy)butane, 1,6-bis(4-benzoyl-3-hydroxyphenoxy)hexane; and cyanoacrylate-based ultraviolet absorbing agents represented by ethyl-2-cyano-3,3-diphenylacrylate.

Examples of the commercially available ultraviolet absorbing agent include TINUVIN 320, TINUVIN 328, TINUVIN 234, TINUVIN 1577, TINUVIN 622, and IRGANOX series, manufactured by BASF Japan Ltd.; ADEKA STAB LA31 manufactured by ADEKA Corporation; and SEESORB 102, SEESORB 103, and SEESORB 501, manufactured by SHIPRO KASEI KAISHA, Ltd. The above-described "TINUVIN", "IRGANOX", "ADEKA STAB", and "SEESORB" are all registered trade names.

In a case where the above radio wave absorber contains an ultraviolet absorbing agent, the content of the ultraviolet absorbing agent in the radio wave absorber is not particularly limited, and it is, for example, preferably 0.2% by mass to 10% by mass with respect to the total mass of the radio wave absorber.

It is preferable that the content of the ultraviolet absorbing agent in the above radio wave absorber is 0.2% by mass or more with respect to the total mass of the radio wave absorber from the viewpoint of improving weather fastness.

In a case where the content of the ultraviolet absorbing agent in the above radio wave absorber is 10% by mass or less with respect to the total mass of the radio wave absorber, the decrease in mechanical strength tends to be suppressed, and the occurrence of blooming tend to be suppressed.

—Singlet Oxygen Quencher—

In a case where the above radio wave absorber contains a singlet oxygen quencher, the content of the singlet oxygen quencher in the radio wave absorber is not particularly limited, and it is, for example, preferably 0.2% by mass to 10% by mass with respect to the total mass of the radio wave absorber.

It is preferable that the content of the singlet oxygen quencher in the above radio wave absorber is 0.2% by mass or more with respect to the total mass of the radio wave absorber from the viewpoint of improving weather fastness.

In a case where the content of the singlet oxygen quencher in the above radio wave absorber is 10% by mass or less with respect to the total mass of the radio wave absorber, the decrease in mechanical strength tends to be suppressed, and the occurrence of blooming tend to be suppressed.

<Method of Producing Radio Wave Absorber>

The method of producing the radio wave absorber of the present disclosure is not particularly limited. For example, it can be produced by a well known method using a magnetic powder, a binder, and, as necessary, a solvent, other additives, and the like. For example, the radio wave absorber can be a molded product obtained by molding a composition containing a magnetic powder and a binder (hereinafter, also referred to as a "composition for forming a radio wave absorber"). The composition for forming a radio wave absorber can be prepared as a kneaded material by kneading, while heating, a mixture of a magnetic powder, a binder, and, as necessary, a solvent, additives, and the like. The kneaded material can be obtained, for example, as a pellet. The kneaded material is molded into a desired shape by a known molding method such as extrusion molding, press molding, injection molding, or in-mold forming, whereby a radio wave absorber (a molded product) can be obtained. The shape of the radio wave absorber is not particularly limited and may be any shape such as a plate shape or a linear shape. The "plate shape" includes a sheet shape and a film shape. The plate-shaped radio wave absorber can also be called a radio wave absorbing plate, a radio wave absorbing sheet, a radio wave absorbing film, or the like. The radio wave absorber may be a radio wave absorber having a single composition (for example, a single-layer radio wave absorbing plate) or a combination of two or more parts having different compositions (for example, a laminate). Further, the radio wave absorber may have a planar shape, may have a three-dimensional shape, or may be a combination of a portion having a planar shape and a portion having a three-dimensional shape. Examples of the planar shape include a sheet shape and a film shape. Examples of the three-dimensional shape include a tubular shape (a cylindrical shape, rectangular tubular shape, or the like), a horn shape, and a box shape (for example, at least one of the surfaces thereof is open).

For example, the thickness of the radio wave absorber is preferably 20.0 mm or less, more preferably 10.0 mm or less, and still more preferably 5.0 mm or less, from the viewpoint of easiness of handling. From the viewpoint of mechanical properties, the thickness is preferably 1.0 mm or more and more preferably 2.0 mm or more. In a case where the thickness of the radio wave absorber is adjusted, for example, the transmission attenuation amount can be controlled. In a case where the radio wave absorber is a laminate, the thickness means the total thickness of the radio wave absorber constituting the laminate. The thickness of the radio wave absorber is a value measured using a digital length measuring machine and, specifically, is an arithmetic mean of the measured values measured at nine points which are randomly selected.

The composition for forming a radio wave absorber may contain or may not contain a solvent. In a case where the composition for forming a radio wave absorber contains a solvent, the solvent is not particularly limited, and examples thereof include water, an organic solvent, and a mixed solvent of water and an organic solvent.

Examples of the organic solvent include alcohols such as methanol, ethanol, n-propanol, i-propanol, and methoxypropanol, ketones such as acetone, methyl ethyl ketone, and cyclohexanone, tetrahydrofuran, acetonitrile, ethyl acetate, and toluene. Among these, the solvent is preferably ketones and more preferably cyclohexanone from the viewpoint of drying rate. In a case where the composition for forming a radio wave absorber contains a solvent, the content of the solvent in the composition is not particularly limited and may be determined depending on the method of producing a radio wave absorber.

The composition for forming a radio wave absorber can be prepared by mixing the above components. The mixing method is not particularly limited, and examples thereof include a method of mixing by stirring. As the stirring unit, a known stirring device can be used. Examples of the stirring device include mixers such as a paddle mixer and an impeller mixer. The stirring time may be set depending on the kind of the stirring device, the composition of a composition for forming a radio wave absorber, and the like.

Examples of one aspect of the method of producing a radio wave absorber include a method of molding a radio wave absorbing composition into a desired shape by a known molding method as exemplified above.

In addition, examples of another aspect of the method of producing a radio wave absorber include a method of applying a composition for forming a radio wave absorber onto a support and producing the radio wave absorber as a radio wave absorbing layer. The support that is used here may be removed before the radio wave absorber is incorporated into an article to which the radio wave absorbability should be imparted or may be incorporated into the article together with the radio wave absorber without being removed.

The support is not particularly limited, and a well known support can be used. Examples of the support include a metal plate (a plate of metal such as aluminum, zinc, or copper), a glass plate, a plastic sheet [a sheet of polyester (polyethylene terephthalate, polyethylene naphthalate, or polybutylene terephthalate), polyethylene (linear low-density polyethylene, low-density polyethylene, or high-density polyethylene), polypropylene, polystyrene, polycarbonate, polyimide, polyamide, polyamide imide, polysulfone, polyvinyl chloride, polyacrylonitrile, polyphenylene sulfide, polyether imide, polyether sulfone, polyvinyl acetal, or an acrylic resin], a plastic sheet on which the metal exemplified in the metal plate described above is laminated or vapor-deposited. The plastic sheet is preferably biaxially stretched. The shape, structure, size, and the like of the support can be appropriately selected. Examples of the shape of the support include a plate shape. The structure of the support may be a monolayer structure or a laminated structure of two or more layers. The size of the support can be appropriately selected depending on the size of the radio wave absorber and the like. The thickness of the support is generally approximately 0.01 mm to 10 mm, for example, preferably 0.02 mm to 3 mm and more preferably 0.05 mm to 1 mm, from the viewpoint of handleability.

The method of applying a composition for forming a radio wave absorber on a support is not particularly limited, and examples thereof include methods using a die coater, a knife coater, an applicator, and the like. The method of drying the coating film formed by applying a composition for forming a radio wave absorber is not particularly limited, and examples thereof include a method using a known heating device such as an oven. The drying temperature and the drying time are not particularly limited. For example, the drying temperature can be in a range of 70° C. to 90° C., and the drying time can be in a range of 1 hour to 3 hours.

The radio wave absorber can be incorporated into various articles to which radio wave absorbability is desired to be imparted. For example, the plate-shaped radio wave absorber can be incorporated into an article in any form as it is or by being bent at any portion. In addition, it can be adjusted to a desired shape by injection molding or the like to be incorporated into an article.

EXAMPLES

Hereinafter, the present invention will be described based on Examples. However, the present invention is not limited to aspects described in Examples. Unless otherwise specified, steps and evaluations described below were carried out in an environment of an ambient temperature of 23° C.±1° C.

The "hexagonal ferrite" described below is a powder of a hexagonal strontium ferrite prepared by the following method, and the "ε-iron oxide" is a powder of ε-iron oxide prepared by the following method.

[Production of Magnetic Powder]
<Preparation of Magnetic Powder 1 (Preparation of Powder of Hexagonal Ferrite)>

As a magnetic powder 1, a powder of a magnetoplumbite-type hexagonal ferrite was prepared by the following method.

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.2 g of aluminum chloride hexahydrate [$AlCl_3 \cdot 6H_2O$] in 216.0 g of water, and a total amount of a solution prepared by adding 113.0 g of water to 181.3 g of an aqueous solution of sodium hydroxide of a concentration of 5 mol/L were added to 400.0 g of water kept at a temperature of 35° C. and stirred, respectively, at a flow rate of 10 mL/min and the same timing, to obtain a first solution.

Next, after allowing the solution temperature of the first solution to be 25° C., 39.8 g of an aqueous solution of sodium hydroxide of a concentration of 1 mol/L was added while maintaining this temperature to obtain a second solution. The pH of the second solution was 10.5±0.5. The pH was measured using a desktop pH meter (F-71 manufactured by HORIBA, Ltd.).

Next, the second solution was stirred for 15 minutes, and a solution containing a precipitate which is a precursor of magnetoplumbite-type hexagonal ferrite (a precursor-containing solution) was obtained.

Next, the precursor-containing solution was subjected to the centrifugal separation treatment (rotation speed: 2,000 rpm, rotation time: 10 minutes] three times, and the obtained precipitate was collected and washed with water.

Next, the collected precipitate was dried in an oven at an internal ambient temperature of 95° C. for 12 hours to obtain a precursor powder.

Next, the precursor powder was put in a muffle furnace, and the temperature in the furnace was set to 1,100° C. in an ambient air atmosphere, followed by sintering for 4 hours, thereby obtaining an aggregated sintered product.

Next, the obtained sintered product was pulverized for 90 seconds using a cutter mill (Wonder Crusher WC-3 manufactured by Osaka Chemical Co., Ltd.) as the pulverizer, with the variable speed dial of the pulverizer being set to "5" (rotation speed: about 10,000 to 15,000 rpm).

From the above, the magnetic powder 1 was obtained.
<Preparation of Magnetic Powder 2 (Preparation of Powder of ε-Iron Oxide)>

As a magnetic powder 2, a powder of ε-iron oxide was prepared by the following method.

4.0 g of an aqueous ammonia solution of a concentration of 25% was added to a mixture obtained by dissolving 8.6 g of iron (III) nitrate nonahydrate, 1.0 g of gallium nitrate (III) octahydrate, 190 mg of cobalt (II) nitrate hexahydrate, 150 mg of titanium (IV) sulfate, and 1.5 g of polyvinylpyrrolidone (PVP) in 90.0 g of pure water, while stirring using a magnetic stirrer, in an ambient air atmosphere and under the condition of an ambient temperature of 25° C., and stirred under the condition of an ambient temperature of 25° C. as it was for 2 hours. To the obtained solution, an aqueous citric acid solution obtained by dissolving 1 g of citric acid in 9 g of pure water was added and stirred for 1 hour. The powder precipitated after stirring was collected by centrifugation, washed with pure water, and dried in a heating furnace having a furnace temperature of 80° C.

800 g of pure water was added to the dried powder, and the powder was dispersed again in water to obtain a dispersion liquid. The obtained dispersion liquid was heated to a liquid temperature of 50° C., and 40 g of an aqueous ammonia solution of a concentration of 25% was added dropwise thereto while stirring. After stirring for 1 hour while maintaining the temperature of 50° C., 14 mL of tetraethoxysilane (TEOS) was added dropwise thereto, and the mixture was stirred for 24 hours. 50.0 g of ammonium sulfate was added to the obtained reaction solution, and the precipitated powder was collected by centrifugation, washed with pure water, and dried in a heating furnace having a furnace temperature of 80° C. for 24 hours, whereby a precursor of ε-iron oxide was obtained.

The obtained precursor was charged into a heating furnace having a furnace temperature of 1,000° C. in an ambient air atmosphere and subjected to heat-treated for 4 hours.

The heat-treated precursor was put into a 4 mol/L sodium hydroxide (NaOH) aqueous solution, and the solution temperature was maintained at 70° C. and stirred for 24 hours to remove the silicic acid compound, which is an impurity, from the heat-treated precursor.

Then, the powder from which the silicic acid compound was removed was collected by centrifugation and washed with pure water to obtain a magnetic powder 2.

[Checking of Crystal Structure]

The crystal structure of the magnetic material constituting each of the above magnetic powders was checked by X-ray diffraction analysis. As the measurement device, X'Pert Pro manufactured by PANalytical Co., Ltd., which is a powder X-ray diffractometer, was used.

The measurement conditions are shown below.
—Measurement Conditions—
X-ray source: CuKα ray
[Wavelength: 1.54 Å (0.154 nm), output: 40 mA, 45 kV]
Scan range: $200 < 2\theta < 70°$
Scan interval: 0.05°
Scan speed: 0.75°/min As a result of the X-ray diffraction analysis, it was confirmed that the magnetic powder 1 has a magnetoplumbite-type crystal structure and is a single-phase powder of a magnetoplumbite-type hexagonal ferrite that does not include a crystal structure other than the magnetoplumbite-type crystal structure. Further, as a result of the X-ray diffraction analysis, it was confirmed that the magnetic powder 2 has a single-phase crystal structure of the ε-phase (an ε-iron oxide-type crystal structure) that does not include crystal structures of the α-phase and the γ-phase.
[Checking of Composition]

The composition of the magnetic material constituting each of the above magnetic powders was checked by high frequency inductively coupled plasma emission spectroscopy. Specifically, the checking was carried out by the following method.

A container beaker containing 12 mg of the magnetic powder and 10 mL of an aqueous solution of hydrochloric acid of a concentration of 4 mol/L was held on a hot plate at a set temperature of 120° C. for 3 hours to obtain a dissolution solution. 30 mL of pure water was added to the obtained dissolution solution, which is then filtered using a membrane filter having a filter pore diameter of 0.1 μm. Elemental analysis of the filtrate obtained as described above was carried out using a high frequency inductively coupled plasma emission spectrometer [ICPS-8100, manufactured by Shimadzu Corporation]. Based on the obtained elemental analysis results, a content of each atom with respect to 100% by atom of iron atoms was obtained. Then, based on the obtained content, the composition of the magnetic material was checked. As a result of the above, it was confirmed that the magnetic powder 1 is a powder of a hexagonal ferrite (a hexagonal strontium ferrite) having a composition of $SrFe_{10.00}Al_{2.00}O_{19}$ and that the magnetic powder 2 is a powder of ε-iron oxide having a composition of $Ga_{0.22}Ti_{0.05}Co_{0.05}Fe_{1.68}O_3$.
[Evaluation of Magnetic Powder]
<Particle Size Distribution>

The number-based particle size distribution of the magnetic powder 1 described above was measured by the laser diffraction and scattering method, and the mode (the so-called mode diameter), the 10% cumulative diameter, and the 90% cumulative diameter were determined.

Specifically, 500 mL of cyclohexanone was added to 10 mg of the magnetic powder and diluted, stirred using a shaker for 30 seconds, and the obtained liquid was used as a sample for particle size distribution measurement.

Next, the particle size distribution of the sample for particle size distribution measurement was measured using a laser diffraction/scattering-type particle size distribution analyzer (Partica LA-960, manufactured by Horiba, Ltd.).

Then, based on the obtained number-based particle size distribution, the mode diameter (unit: μm) which is the mode, $D_{10}$ (unit: μm) which is the 10% cumulative diameter, and $D_{90}$ (unit: μm) which is the 90% cumulative diameter was determined. In addition, the value of "$(D_{90}-D_{10})$/mode diameter" was calculated.

As a result of the above, the magnetic powder 1 had a mode diameter of 6.7 μm, $D_{10}$ of 4.1 μm, $D_{90}$ of 9.5 μm, and a value of "$(D_{90}-D_{10})$/mode diameter" of 0.81.

For each of the above magnetic powders, the magnetic field strength Ha, coercive force (Hc), and the saturation magnetization (δs) per unit mass were measured by the following methods.

As the measurement device, an oscillating sample magnetometer (model number: TM-TRVSM5050-SMSL) manufactured by TAMAKAWA Co. Ltd. was used in an environment of an ambient temperature of 23° C. and under the conditions of a maximum applied magnetic field of 50 kOe, and a magnetic field sweep rate of 25 Oe/s, and the intensity of magnetization of the magnetic powder with respect to the applied magnetic field was measured. From the measurement results, a magnetic field (H)–magnetization (M) curve of the magnetic powder was obtained. Based on the obtained magnetic field (H)–magnetization (M) curve, the coercive force (Hc) (unit: kOe) and the saturation magnetization (δs) per unit mass (unit: emu/g) of the magnetic powder were determined. In, addition, based on the obtained magnetic field (H)–magnetization (M) curve, a magnetic field strength which corresponds to 90% of a magnetization quantity at an applied magnetic field of 50 kOe was determined, which was denoted by the magnetic field strength Ha.

As a result of the above, the magnetic powder 1 had a magnetic field strength Ha of 24.5 kOe, a coercive force (Hc) of 10.5 kOe, and a saturation magnetization (δs) per unit mass of 43.2 emu/g. In addition, the magnetic powder 2 had a magnetic field strength Hα of 23.5 kOe, a coercive force (Hc) of 4.6 kOe, and a saturation magnetization (δs) of 18.5 emu/g.

Examples 1 to 4 and Comparative Examples 1 to 4

Using a kneader (Labo Plastomill manufactured by Toyo Seiki Seisaku-sho, Ltd.), the magnetic powder shown in Table 1 and a binder (an olefin-based thermoplastic elastomer (TPO) [MILASTOMER (registered trade name) 7030NS manufactured by Mitsui Chemicals, Inc.]) were knead for 20 minutes at a set temperature of 200° C. to obtain a composition for forming a radio wave absorber (a pellet-shaped kneaded material). The above binder is a binder that does not contain a carbon component.

The obtained composition for forming a radio wave absorber was press-molded using a heating press to obtain a radio wave absorber as a plate-shaped molded product having a square plane, one side of which had a length of 100 mm. The volume filling rate of the magnetic material in each of the radio wave absorbers was adjusted by changing the mixing ratio between the magnetic powder and the binder at the time of preparing the composition for forming a radio wave absorber. The thickness of each of the radio wave absorbers was adjusted by changing the pressing conditions at the time of molding.

Comparative Example 5

A radio wave absorber was prepared by the same method as in Example 3 except that, at the time of preparing a composition for forming a radio wave absorber, a magnetic powder was not added, and a graphite powder (CNP-35 manufactured by Ito Graphite Co., Ltd.) was added as the carbon component, where the amount of the graphite powder was such an amount that the volume filling rate in the radio wave absorber to be prepared became 30% by volume.

Comparative Example 6

A radio wave absorber was obtained by the same method as in Example 2 except that, at the time of preparing a composition for forming a radio wave absorber, a graphite powder (CNP-35 manufactured by Ito Graphite Co., Ltd.) was mixed as the carbon component with the above binder, where the amount of the graphite powder was such an amount that the volume filling rate in the radio wave absorber to be prepared became 5.0% by volume, and then the mixture was mixed with the magnetic powder shown in Table 1 and the subsequent steps were carried out.
[Evaluation of Radio Wave Absorber]
<Volume Filling Rate of Magnetic Powder>

Each of the above radio wave absorbers was cut, and a plate-shaped measurement sample having a square plane, one side of which had a length of 5 mm was cut out. The thickness of this measurement sample is the same as the thickness of each of the radio wave absorbers.

After the above measurement sample was attached to the stage, a focused ion beam (FIB) device (MI4050 manufactured by Hitachi, Ltd.) was used to carry out FIB processing of exposing the thickness direction to form a cross-section, whereby a cross-section observation sample was prepared. The prepared cross-section observation sample was observed by SEM, and a cross-section image (SEM image) was taken. A field emission scanning electron microscope (SU-8220 manufactured by Hitachi, Ltd.) was used as the SEM, a cross-section observation sample was set on a stage so that the FIB-processed cross-section faced upward, and a cross-section SEM image with a visual field of 30 μm×40 μm was obtained under the conditions of an acceleration voltage of 15 kV and an observation magnification of 3,000 folds. The obtained cross-section SEM image was subjected to binarization processing, and the proportion (in terms of the area) of the magnetic powder is calculated. The brightness distribution of the obtained cross-section SEM image was represented by a histogram, and then the binarization process was carried out using a value of the brightness of the central part between the peak of the bright portion (the portion of the magnetic powder) and the peak of the dark portion (the portion other than the magnetic powder) as the threshold value.

The above operation was carried out on five measurement samples cut out from different positions of each of the radio wave absorbers, and the volume filling rate of the magnetic powder in each of the radio wave absorbers was determined as the arithmetic mean of the obtained five values.

<Thickness of Radio Wave Absorber>

For each of the above radio wave absorbers, the thickness was determined as the arithmetic mean of the measured values measured at nine points which were randomly selected, using a digital length measuring machine [Litematic (registered trade name) VL-50 Å manufactured by Mitutoyo Corporation].

<Transmission Attenuation Amount and Reflection Attenuation Amount>

The transmission attenuation amount (unit: dB) and the reflection attenuation amount (unit: dB) of each of the above radio wave absorbers were measured by the following method.

As the measurement device, a vector network analyzer (product name: N5225B) manufactured by Keysight Technologies and a horn antenna (product name: RH12S23) manufactured by KEYCOM Corp. were used to measure an S parameter with a free space method by setting an incidence angle to 0° and a sweep frequency to 60 GHz to 90 GHz, with one plane of each of the above radio wave absorbers being directed toward the incident side, S21 of the S parameter at a frequency of 76.5 GHz was taken as the transmission attenuation amount, and S11 of the S parameter at a frequency of 76.5 GHz was taken as the reflection attenuation amount.

<Directivity of Radar>

Each of the above radio wave absorbers was installed in the radio wave transmitting and receiving unit of the evaluation device in a state of being curved in a horn shape. Then, a metal plate that reflects radio waves was installed at a position (a position at an angle of 45° in a case of the front face of the radio wave transmitting and receiving unit being set to an angle of 0°) 1 m away from the radio wave transmitting and receiving unit, and it was evaluated whether this metal plate would be recognized by the radio wave transmitting and receiving unit. A case of being clearly recognized was denoted by an evaluation result C, a case of being slightly recognized was denoted by an evaluation result B, and a case of not being recognized was denoted by an evaluation result A.

<Unnecessary Reflection Component>

Each of the above radio wave absorbers was installed in the radio wave transmitting and receiving unit of the evaluation device in a state of being curved in a horn shape. Then, a metal plate that reflects radio waves was installed at a position (on a front face (a position of an angle of 0°) of the radio wave transmitting and receiving unit) 10 m away from the radio wave transmitting and receiving unit, and it was evaluated whether this metal plate would be recognized by the radio wave transmitting and receiving unit. A case of being capable of being normally recognized was denoted by an evaluation result A, a case of being capable of being almost normally recognized was denoted by an evaluation result B, and a case of being incapable of being recognized was denoted by an evaluation result C.

The above results are shown in Table 1.

TABLE 1

| | Example 1 | Example 2 | Example 3 | Example 4 | Comparative Example 1 | Comparative Example 2 | Comparative Example 3 | Comparative Example 4 | Comparative Example 5 | Comparative Example 6 |
|---|---|---|---|---|---|---|---|---|---|---|
| Kind of magnetic powder | Magnetic powder 1 | Magnetic powder 1 | Magnetic powder 1 | Magnetic powder 2 | Magnetic powder 1 | Magnetic powder 1 | Magnetic powder 1 | Magnetic powder 1 | Absent | Magnetic powder 1 |
| Addition of Graphite | No | No | No | No | No | No | No | No | Yes | Yes |
| Volume filling rate of magnetic powder [%] | 15 | 30 | 30 | 30 | 15 | 40 | 40 | 50 | 30 | 30 |
| Thickness [mm] | 4.5 | 2.0 | 3.0 | 3.0 | 3.0 | 2.0 | 3.0 | 2.0 | 3.0 | 2.0 |
| Transmission attenuation amount (76.5 GHz) [dB] | 11.0 | 8.7 | 16.0 | 11.2 | 5.6 | 13.8 | 24.1 | 19.0 | 21.3 | 15.0 |
| Reflection attenuation amount (76.5 GHz) [dB] | 13.2 | 10.6 | 10.4 | 8.2 | 13.5 | 7.4 | 7.6 | 6.0 | 2.0 | 6.5 |
| Directivity of radar | A | B | A | A | C | A | A | A | A | A |
| Unnecessary reflection component | A | A | A | B | A | C | C | C | C | C |

From the results shown in Table 1, it can be confirmed that the radio wave absorber of Examples is a radio wave absorber that is capable of contributing to the improvement of radar recognition accuracy.

One aspect of the present invention is useful in the technical field of carrying out various automatic driving controls such as automatic driving control of an automobile.

What is claimed is:

1. A radio wave absorber comprising:
a magnetic powder; and
a binder,
wherein a volume filling rate of the magnetic powder in the radio wave absorber is 35% by volume or less,
a transmission attenuation amount at a frequency of 76.5 GHz is 8.0 dB or more and 15.0 dB or less,
a reflection attenuation amount at a frequency of 76.5 GHz is 8.0 dB or more, and
a thickness of the radio wave absorber is 2.0 mm or more.

2. The radio wave absorber according to claim 1,
wherein the volume filling rate of the magnetic powder is 15% by volume or more and 35% by volume or less.

3. The radio wave absorber according to claim 1,
wherein the radio wave absorber is a molded product obtained by molding a composition containing the magnetic powder and the binder.

4. The radio wave absorber according to claim 1,
wherein a thickness of the radio wave absorber is 2.0 mm or more and 10.0 mm or less.

5. The radio wave absorber according to claim 1,
wherein the magnetic powder includes a powder of a hexagonal ferrite.

6. The radio wave absorber according to claim 5,
wherein the hexagonal ferrite has a composition represented by Formula 1, $$AFe_{(12-x)}Al_xO_{19} \quad \text{Formula 1}$$

in Formula 1, A represents at least one kind of atom selected from the group consisting of Sr, Ba, Ca, and Pb, and x satisfies 1.50≤x≤8.00.

7. The radio wave absorber according to claim 6,
wherein an atom represented by A in Formula 1 includes Sr.

8. The radio wave absorber according to claim 1,
wherein the magnetic powder includes a powder of ε-iron oxide.

9. The radio wave absorber according to claim 8,
wherein the ε-iron oxide is an ε-iron oxide containing one or more atoms selected from the group consisting of a gallium atom, a titanium atom, and a cobalt atom.

10. The radio wave absorber according to claim 2,
wherein the magnetic powder includes a powder of a hexagonal ferrite.

11. The radio wave absorber according to claim 10,
wherein the hexagonal ferrite has a composition represented by Formula 1, $$AFe_{(12-x)}Al_xO_{19} \quad \text{Formula 1}$$

in Formula 1, A represents at least one kind of atom selected from the group consisting of Sr, Ba, Ca, and Pb, and x satisfies 1.50≤x≤8.00.

12. The radio wave absorber according to claim 11,
wherein an atom represented by A in Formula 1 includes Sr.

13. The radio wave absorber according to claim 2,
wherein the magnetic powder includes a powder of ε-iron oxide.

14. The radio wave absorber according to claim 13,
wherein the ε-iron oxide is an ε-iron oxide containing one or more atoms selected from the group consisting of a gallium atom, a titanium atom, and a cobalt atom.

15. The radio wave absorber according to claim 4,
wherein the magnetic powder includes a powder of a hexagonal ferrite.

16. The radio wave absorber according to claim 15,
wherein the hexagonal ferrite has a composition represented by Formula 1, $$AFe_{(12-x)}Al_xO_{19} \quad \text{Formula 1}$$

in Formula 1, A represents at least one kind of atom selected from the group consisting of Sr, Ba, Ca, and Pb, and x satisfies 1.50≤x≤8.00.

17. The radio wave absorber according to claim 16,
wherein an atom represented by A in Formula 1 includes Sr.

18. The radio wave absorber according to claim 4,
wherein the magnetic powder includes a powder of ε-iron oxide.

19. The radio wave absorber according to claim 18,
wherein the ε-iron oxide is an ε-iron oxide containing one or more atoms selected from the group consisting of a gallium atom, a titanium atom, and a cobalt atom.

* * * * *